US011391677B2

(12) United States Patent
Witte et al.

(10) Patent No.: US 11,391,677 B2
(45) Date of Patent: Jul. 19, 2022

(54) METHODS AND APPARATUS FOR PREDICTING PERFORMANCE OF A MEASUREMENT METHOD, MEASUREMENT METHOD AND APPARATUS

(71) Applicant: ASML Netherlands B.V., Veldhoven (NL)

(72) Inventors: Stefan Michiel Witte, Hoofddorp (NL); Gijsbert Simon Matthijs Jansen, Amsterdam (NL); Lars Christian Freisem, Amsterdam (NL); Kjeld Sijbrand Eduard Eikema, Hoofddorp (NL); Simon Gijsbert Josephus Mathijssen, Rosmalen (NL)

(73) Assignee: ASML Netherlands B. V., Veldhoven (NL)

( * ) Notice: Subject to any disclaimer, the term of this patent is extended or adjusted under 35 U.S.C. 154(b) by 158 days.

(21) Appl. No.: 16/751,104

(22) Filed: Jan. 23, 2020

(65) Prior Publication Data
US 2020/0232931 A1     Jul. 23, 2020

Related U.S. Application Data

(63) Continuation of application No. 15/979,990, filed on May 15, 2018, now Pat. No. 10,648,919.

(30) Foreign Application Priority Data

May 31, 2017   (EP) .................................... 17173786
Oct. 3, 2017   (EP) .................................... 17194552

(51) Int. Cl.
*G01J 3/00*      (2006.01)
*G01N 21/88*    (2006.01)
(Continued)

(52) U.S. Cl.
CPC ............ *G01N 21/8806* (2013.01); *G01J 1/42* (2013.01); *G01J 1/4257* (2013.01); *G01J 9/00* (2013.01);
(Continued)

(58) Field of Classification Search
CPC .. G01N 21/314; G01N 21/33; G01N 21/3504; G01J 3/10; G01J 3/42
(Continued)

(56) References Cited

U.S. PATENT DOCUMENTS 5,233,174 A    8/1993   Zmek
5,861,323 A *   1/1999   Hayes ................. H01L 21/6835
                                                   438/111

(Continued)

FOREIGN PATENT DOCUMENTS

CN        1809726 A    7/2006
CN      102419213 A    4/2012
(Continued)

OTHER PUBLICATIONS

Non-Final Office Action directed to U.S. Appl. No. 15/979,990, dated Aug. 26, 2019; 14 pages.
(Continued)

*Primary Examiner* — Md M Rahman
(74) *Attorney, Agent, or Firm* — Sterne, Kessler, Goldstein & Fox P.L.L.C.

(57) ABSTRACT

A metrology apparatus (302) includes a higher harmonic generation (HHG) radiation source for generating (310) EUV radiation. Operation of the HHG source is monitored using a wavefront sensor (420) which comprises an aperture array (424, 702) and an image sensor (426). A grating (706) disperses the radiation passing through each aperture so that the image detector captures positions and intensities of higher diffraction orders for different spectral components
(Continued)

and different locations across the beam. In this way, the wavefront sensor can be arranged to measure a wavefront tilt for multiple harmonics at each location in said array. In one embodiment, the apertures are divided into two subsets (A) and (B), the gratings (706) of each subset having a different direction of dispersion. The spectrally resolved wavefront information (430) is used in feedback control (432) to stabilize operation of the HGG source, and/or to improve accuracy of metrology results.

20 Claims, 13 Drawing Sheets

(51) Int. Cl.
*G03F 7/20* (2006.01)
*G01J 9/00* (2006.01)
*G01J 1/42* (2006.01)
*G01N 21/95* (2006.01)

(52) U.S. Cl.
CPC ......... *G01N 21/9501* (2013.01); *G03F 7/706* (2013.01); *G03F 7/70133* (2013.01); *G03F 7/70141* (2013.01); *G03F 7/70191* (2013.01); *G01J 2001/4247* (2013.01); *G01J 2009/002* (2013.01)

(58) Field of Classification Search
USPC .......................................................... 356/51
See application file for complete search history.

(56) References Cited

U.S. PATENT DOCUMENTS

| | | | |
|---|---|---|---|
| 6,548,797 B1 | 4/2003 | Ai | |
| 6,639,683 B1 | 10/2003 | Tumbar et al. | |
| 7,649,621 B2 | 1/2010 | Braunecker et al. | |
| 7,952,726 B2 | 5/2011 | Kato et al. | |
| 8,004,691 B2 | 8/2011 | Ouchi et al. | |
| 8,356,900 B2 | 1/2013 | Zhou | |
| 10,648,919 B2 | 5/2020 | Witte et al. | |
| 2001/0020493 A1* | 9/2001 | Nanaji | B67D 7/0486 141/59 |
| 2002/0145717 A1 | 2/2002 | Baselmans et al. | |
| 2003/0222196 A1 | 12/2003 | Hutchin et al. | |
| 2004/0196450 A1 | 11/2004 | Levecq et al. | |
| 2007/0258655 A1* | 11/2007 | Motominami | H04N 1/0035 382/254 |
| 2009/0216399 A1* | 8/2009 | Ishikawa | G07C 5/008 701/31.4 |
| 2015/0331336 A1 | 11/2015 | Quintanilha et al. | |
| 2016/0088213 A1* | 3/2016 | Miyai | G01N 21/956 348/349 |
| 2016/0109290 A1 | 4/2016 | Klennert | |
| 2016/0282282 A1 | 9/2016 | Quintanilha et al. | |
| 2017/0031246 A1 | 2/2017 | Den Boef | |
| 2017/0045823 A1 | 2/2017 | Quintanilha | |
| 2017/0184511 A1 | 6/2017 | Den Boef et al. | |
| 2017/0184981 A1 | 6/2017 | Quintanilha et al. | |
| 2018/0348145 A1 | 12/2018 | Witte et al. | |

FOREIGN PATENT DOCUMENTS

| | | |
|---|---|---|
| CN | 202420688 U | 9/2012 |
| CN | 102879110 A | 1/2013 |
| DE | 102006007172 B4 | 1/2013 |
| EP | 2314202 A1 | 4/2011 |
| EP | 3296723 A1 | 3/2018 |
| EP | 3321739 A1 | 5/2018 |
| JP | 2006-030016 A | 2/2006 |
| JP | 2006-332586 A | 12/2006 |
| JP | 2007-234685 A | 9/2007 |
| JP | 2010-206033 A | 9/2010 |
| RU | 2036491 | 5/1995 |
| TW | 530150 B | 5/2003 |
| TW | I548393 B | 11/2016 |
| TW | 2017/30546 A | 9/2017 |
| WO | WO 2015/172963 A1 | 11/2015 |
| WO | WO 2017/025392 A1 | 2/2017 |
| WO | WO 2017/108404 A1 | 6/2017 |
| WO | WO 2017/108410 A1 | 6/2017 |

OTHER PUBLICATIONS

Notice of Allowance directed to U.S. Appl. No. 15/979,990, dated Jan. 2, 2020; 8 pages.
International Search Report and Written Opinion of the International Searching Authority directed to related International Patent Application No. PCT/EP2018/061338, dated Jul. 31, 2018; 9 pages.
International Preliminary Report on Patentability directed to related International Patent Application No. PCT/EP2018/061338, dated Dec. 3, 2019; 6 pages.
Taiwanese Search Report from related Taiwanese Patent Application No. 107117845 with English-language Translation attached, dated Jul. 17, 2019; 8 pages.
Baker, "X-ray wavefront characterization with two-dimensional wavefront sensors: shearing interferometers and Hartmann wavefront sensors," Optical Engineering, Society of Photographic Instrumentation Engineers, Feb. 2013, vol. 52; 10 pages.
Polo et al., "Wavefront measurement for EUV lithography system through Hartmann sensor," Metrology, Inspection, and Process Control for Microlithography XXV, Society of Photographic Instrumentation Engineers, Apr. 20, 2011, vol. 7971; 8 pages.
Mercere et al., "Hartmann wave-front measurement at 13.4 nm with lEUV 120 accuracy," Optics Letters, Optical Society of America, Sep. 1, 2003, vol. 28, No. 17, pp. 1534-1536.
Künzel et al., "Shot-to-shot intensity and wavefront stability of high-harmonic generation," Applied Optics, The Optical Society, May 20, 2015, vol. 54, No. 15, pp. 4745-4749.
Naulleau et al., "Extreme-ultraviolet phase-shifting point-diffraction interferometer: a wave-front metrology tool with subangstrom reference-wave accuracy," Applied Optics, The Optical Society, vol. 36, No. 35, pp. 7252-7263.
Frumker et al., "Frequency-resolved high-harmonic wavefront characterization," Optical Letters, Optical Society of America, Oct. 1, 2009, vol. 34, No. 19, pp. 3026-3028.
Austin et al., "Vectorial Phase Retrieval for Linear Characterization of Attosecond Pulses," Physics Review Letters, American Physical Society, Sep. 19, 2011, vol. 107; 4 pages.
Braig et al., "An EUV beamsplitter based on conical grazing incidence diffraction," Optics Express, the Optical Society, Jan. 16, 2012, vol. 20, No. 2, pp. 1825-1838.
"Shack-Hartmann wavefront Sensor," Wikipedia, Jan. 21, 2017; 1 page.
"Hartmann Wavefront Analyzer Tutorial," Spiricon, Inc., Part No. 10885-001, Rev. D, 2004; 19 pages.
Mann et al., "Hartmann wavefront sensor for EUV radiation," Extreme Ultraviolet (EUV) Lithography IV, Society of Photographic Instrumentation Engineers, Apr. 1, 2013, vol. 8679; 10 pages.
Polo et al., "Sub-aperture phase reconstruction from a Hartmann Wavefront Sensor by phase retrieval method for application in EUV adaptive optics," Extreme Ultraviolet (EUV) Lithography III, Society of Photographic Instrumentation Engineers, Mar. 23, 2012, vol. 8322; 9 pages.
Flöter et al., "EUV Hartmann sensor for wave front measurements at the Free-electron LASer in Hamburg," New Journal of Physics, May 9, 2010, vol. 12; 14 pages.
Keitel et al., "Hartmann wavefront measurements at FLASH," Advances in X-ray Free-Electron Lasers II: Instrumentation, Society of Photographic Instrumentation Engineers, May 3, 2013, vol. 8778; 8 pages.
Baker, "X-ray wavefront characterization with two-dimensional wavefront sensors: shearing interferometers and Hartmann wavefront

(56) References Cited

OTHER PUBLICATIONS sensors," Optical Engineering, Society of Photographic Instrumentation Engineers, Oct. 15, 2012, vol. 8503; 11 pages.

* cited by examiner

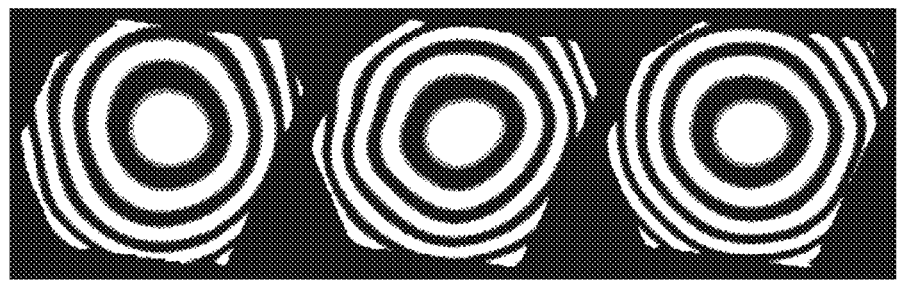
49.2nm
Fig. 11(a)
44.1nm
Fig. 11(b)
39.9 nm
Fig. 11(c)
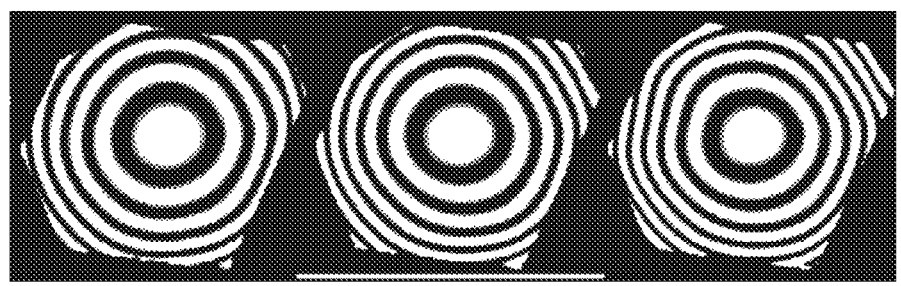
36.4nm
Fig. 11(d)
33.5nm
Fig. 11(e)
31.0nm
Fig. 11(f)
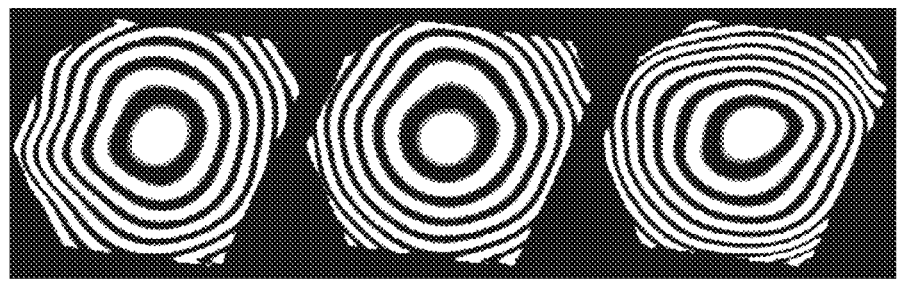
28.9nm
Fig. 11(g)
27.0nm
Fig. 11(h)
25.4nm
Fig. 11(i)
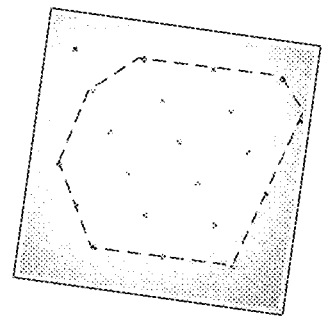
Fig. 11(j)

METHODS AND APPARATUS FOR PREDICTING PERFORMANCE OF A MEASUREMENT METHOD, MEASUREMENT METHOD AND APPARATUS

CROSS REFERENCE TO RELATED APPLICATIONS

This application is a continuation of U.S. patent application Ser. No. 15/979,990, filed May 15, 2018, which claims priority of EP Patent Application No. 17194552, filed Oct. 3, 2017 and EP Patent Application No. 17173786, filed May 31, 2017, and are incorporated herein in their entirety by reference.

FIELD

The present disclosure relates to methods and apparatus for inspection (e.g., metrology) usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

At the same time, the known inspection techniques employ radiation in the visible or ultraviolet waveband. This limits the smallest features that can be measured, so that the technique can no longer measure directly the smallest features made in modern lithographic processes. To allow measurement of smaller structures, it has been proposed to use radiation of shorter wavelengths, similar for example to the extreme ultraviolet (EUV) wavelengths used in EUV lithography. Such wavelengths may be in the range 1 to 100 nm, for example, or 1-125 nm. Part or all of this wavelength range may also be referred to as soft x-ray (SXR) wavelengths. Some authors may use SXR to refer to a narrower range of wavelengths, for example in the range 1-10 nm or 1-20 nm. For the purposes of the present disclosure, these terms SXR and EUV will be used without implying any hard distinction. Metrology using harder x-rays, for example in the range 0.1-1 nm is also contemplated. Examples of transmissive and reflective metrology techniques using these wavelengths in transmissive and/or reflective scattering modes are disclosed in published patent application US2015331336A1. Further examples of metrology techniques and apparatuses using these wavelengths in transmissive and/or reflective scattering modes are disclosed in the published patent applications US2016282282A1, US2017045823A1 and WO2017025392A1 and in the international patent application number PCT/EP2016/080058, not yet published at the present priority date (now published as US2017184981A1). The contents of all these applications are incorporated herein by reference.

Convenient sources of SXR radiation include higher harmonic generation (HHG) sources, in which infrared pump radiation from a laser is converted to shorter wavelength radiation by interaction with a gaseous medium. HHG sources are available for example from KMLabs, Boulder Colo., USA (http://www.kmlabs.com/). Various modifications of HHG sources are also under consideration for application in inspection apparatus for lithography. Some of these modifications are disclosed for example in European patent application number 16198346.5 dated Nov. 11, 2016, not published at the priority date of the present application. Other modifications are disclosed in U.S. patent application Ser. No. 15/388,463 and international patent application PCT/EP2016/080103, both claiming priority from European patent application no. 15202301.6 dated Dec. 23, 2015 also not yet published at the priority date of the present application (now published as US2017184511A1). European patent application no. 16188816.9 dated Sep. 14, 2016, not published at the present priority date, describes the correction of wavefronts in an HHG radiation source to minimize blurring of the measurement spot in an inspection apparatus. The contents of all of these applications are incorporated herein by reference.

A wavefront measurement can be used for example to indicate the ability to focus a light source to a specific spot size and shape. This is important information when a high SXR flux is needed in a confined and well-defined spot, for example for overlay metrology. If such parameters can be measured quickly, the information can be used in a feedback loop for adaptive control of the SXR beam used in metrology, or for improving the results of a metrology measurement.

Measurement of wavefronts in the extreme ultraviolet (EUV) and soft x-ray (SXR) spectral region is challenging because of high absorption by most materials and the difficulty to fabricate focusing optics. A common approach in the EUV wavebands is to use a Hartmann sensor, which is an array of apertures, to measure the local phase gradient. Examples are described is Mercère et al., Opt. Lett. 28, 1534 (2003), in Künzel et al., Appl. Opt. 54, 4745 (2015), and in published patent application US2004196450A1. Another frequently used approach in the EUV is an interferometric technique called phase-shifting point diffraction interferometry (Naulleau et al., Appl. Opt. 38, 7252 (1999)). Two newer, non-standard techniques are also mentioned. The first technique is based on single slit diffraction measured across the beam profile by scanning the slit (Frumker et al., Opt. Lett. 34, 3026 (2009)). The second technique uses the interference pattern between two identical beams, and reconstructs the wavefront by a lateral shearing algorithm (Austin et al., Opt. Lett. 36, 1746 (2011)).

Considering the HHG source which is promising for EUV/SXR metrology, HHG sources are by nature broadband in spectrum and tend to suffer from variations in beam parameters due to the nonlinear generation process. While fast spectrum measurements exist, a fast 2-D wavefront measurement can only be done without spectral resolution, i.e. integrated over the full spectrum of the source. Recent measurements show that there can be significant variation of the wavefront for different harmonics. Thus, there is a desire to measure spectrally resolved 2-D wavefronts on timescales shorter than a typical measurement, and potentially to perform feedback on the HHG source to stabilize its characteristics.

For spectrally resolved wavefront measurements, each of the techniques mentioned in the description of the state-of-the-art has to be combined with an additional spectrometer. This results in a constraint to measure the wavefront only in one dimension because an EUV spectrometer requires one spatial dimension of the camera to record the spectrum. To measure the wavefront with spectral resolution and 2-D would then require a scanning process, which would be slow and cumbersome.

Attempts have been made to resolve spectral components in wavefront sensors, using color filters in the apertures (see for example US2016109290A1 and RU2036491C1). Unfortunately, these techniques reduce the spatial resolution of the sensor in proportion to the number of colors, and color filters are not readily available for EUV/SXR wavelengths.

SUMMARY OF THE INVENTION

The invention aims to improve the monitoring and/or control of operating conditions in a radiation source arrangement, for example an EUV or SXR radiation source, including for example an HHG radiation source arrangement.

The invention aims in another aspect to provide a wavefront sensor with 2-D spatial resolution and spectral resolution. The wavefront sensor may be adapted for use in EUV and SXR wavelengths, or in any waveband.

The present invention in a first aspect provides a radiation source arrangement operable to generate a beam of radiation, the radiation source arrangement further comprising:

a wavefront sensor for at least intermittently measuring a tilt of a wavefront at an array of locations across the generated beam of radiation; and a processor for determining an operating condition of the radiation source arrangement based at least partly on the measured wavefront tilt, wherein said wavefront sensor is provided with a dispersive element at each location in said array, and is arranged to measure wavefront tilts with spectral resolution at each location in said array.

The invention further provides an inspection apparatus comprising an illumination system for delivering inspection radiation to a target structure and a detection system for detecting said inspection radiation after interaction with the target structure, and wherein the illumination system includes a radiation source arrangement according to the first aspect of the invention as set forth above.

The invention further provides a method of monitoring an operating condition of a radiation source arrangement, the method comprising at least intermittently measuring a tilt of a wavefront at an array of locations across a beam of radiation generated by said radiation source arrangement and determining an operating condition of the radiation source arrangement based at least partly on the measured wavefront tilt, wherein wavefront tilts are measured with spectral resolution at each location in said array.

In this way, a combination of spectral resolution and spatial resolution can be obtained which is not obtained in the known wavefront sensors. Measuring wavefront tilts with spectral resolution may involve, for example, measuring a wavefront tilt for each of a plurality of spectral components. In an embodiment, it is envisaged that the same plurality of spectral components may be measured at every location in the array, to obtain wavefront information that is completely spectrally and spatially resolved. However, other implementations may be envisaged based on the principles of the present disclosure. The present disclosure does not exclude implementations where wavefront tilts for different pluralities of spectral components are measured at different locations in the array of locations. The present disclosure does not exclude implementations where another array of locations are provided, for example interspersed with the array of locations of the invention, at which wavefront tilts are detected in the conventional manner, without any spectral resolution.

The invention further provides a method of controlling a radiation source arrangement by further comprising adjusting at least one operating parameter of the method automatically in response at least partly to the operating condition determined by the processor based on the wavefront tilts of one or more spectral components.

The invention further provides a method of inspecting structures that have been formed on a substrate by a lithographic process, the method comprising:

illuminating a target structure with inspection radiation generated by higher harmonic generation controlled by the method according to the invention as set forth above; and detecting a portion of said inspection radiation after interaction with the target structure.

The inspection method may further comprise determining a property of the target structure based at least partly on the detected portion of said inspection radiation.

The inspection method may further comprise determining at least one performance parameter of the lithographic process based at least partly on a determined property of the target structure.

The invention further provides a method of manufacturing devices, the method including a lithographic process step, wherein, before or after performing said lithographic process step, properties of one or more target structures on a substrate are determined by an inspection method according to the invention as set forth above, and wherein the determined properties are used to adjust parameters of the lithographic process step for the processing of the substrate and/or further substrates.

The invention further provides a computer program product comprising machine-readable instructions for causing a processor to implement the processor and/or the controller of a radiation source arrangement according to the invention, as set forth above. The machine-readable instructions may be provided in a non-transitory storage medium.

The invention in a further, independent aspect provides a wavefront sensor for measuring a tilt of a wavefront at an array of locations across a beam of radiation, wherein said wavefront sensor is provided with a dispersive element at each location in said array and is arranged to measure wavefront tilts with spectral resolution at each location in said array.

Such a wavefront sensor can be used to monitor the condition of a radiation source arrangement as set for the above, or it can be used for any desired purpose. The wavefront sensor may be adapted for use with EUV radiation, or with radiation in any other waveband.

In any aspect of the invention, the array of locations may be defined by one or more spacing vectors, such that a direction of dispersion of each dispersive element is not parallel with any of said spacing vectors. This allows a desired spatial resolution to be achieved without interference between spectral components from different locations in the array.

The array of locations may be divided into two or more subsets, the dispersive elements of each subset having a different direction of dispersion. This allows a further increase spatial resolution, and/or further separation of the spectral components of the different locations in the array.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which:

FIGS. 11(a)-11j show wavefronts for nine spectral components reconstructed from the diffraction image shown in FIG. 9;

DETAILED DESCRIPTION OF EXEMPLARY EMBODIMENTS

Before describing embodiments of the invention in detail, it is instructive to present an example environment in which embodiments of the present invention may be implemented.

Figure 1:
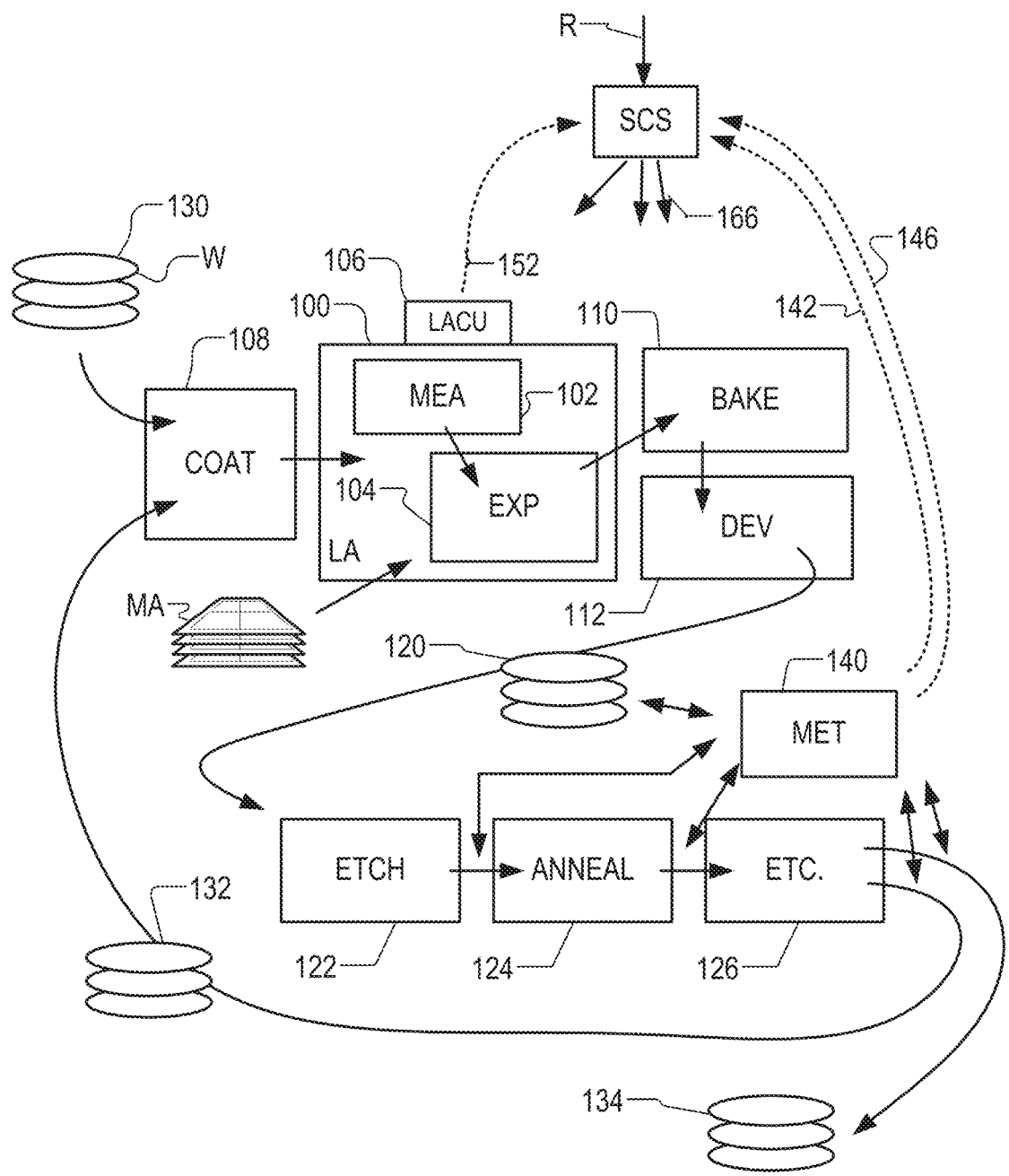
FIG. 1 depicts a lithographic apparatus together with other apparatuses forming a production facility for semiconductor devices, and including a metrology apparatus including an inspection apparatus according to an embodiment of the present invention.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, and 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore, some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Metrology apparatus 140 may if desired implement a hybrid metrology system. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122.

Each generation of lithographic manufacturing technology (commonly referred to as a technology "node") has tighter specifications for performance parameters such as CD. One of the main challenges in metrology is that the size of features within the product becomes smaller and smaller, and this smaller feature size should be reflected also in the design of metrology targets. Accordingly, metrology apparatus 140 may include an inspection apparatus designed to operate with radiation at wavelengths shorter than conventional visible or UV wavelengths. As a particular example, soft x-ray (SXR) radiation with wavelengths in the range 1-10 nm or 1-20 nm may be used, or more generally extreme ultraviolet EUV radiation may be used, with wavelengths in the range 1-100 nm.

Rather than rely for all purposes on a single inspection apparatus, a variety of inspection apparatuses may be used in practice. A hybrid metrology system may include scatterometers working at different wavelengths, and additional types of inspection apparatus, so that multiple types of measurement can be performed within the hybrid metrology system to obtain a better overall measurement of a parameter or parameters of interest on a given target structure.

Each of the inspection apparatuses within a hybrid metrology system can have a particular illumination system for radiation of a particular characteristic. More detailed examples of the types of apparatuses that can be combined is given in the pending international patent application number PCT/EP2016/080058, mentioned above. For the purposes of the present disclosure, it is assumed that metrology apparatus 140 is an inspection apparatus using soft x-ray (SXR or EUV) radiation in a waveband shorter than 100 nm. This SXR inspection apparatus can be applied as one of the inspection apparatuses in a hybrid metrology system, but can also be applied independently, if desired.

Figure 2:
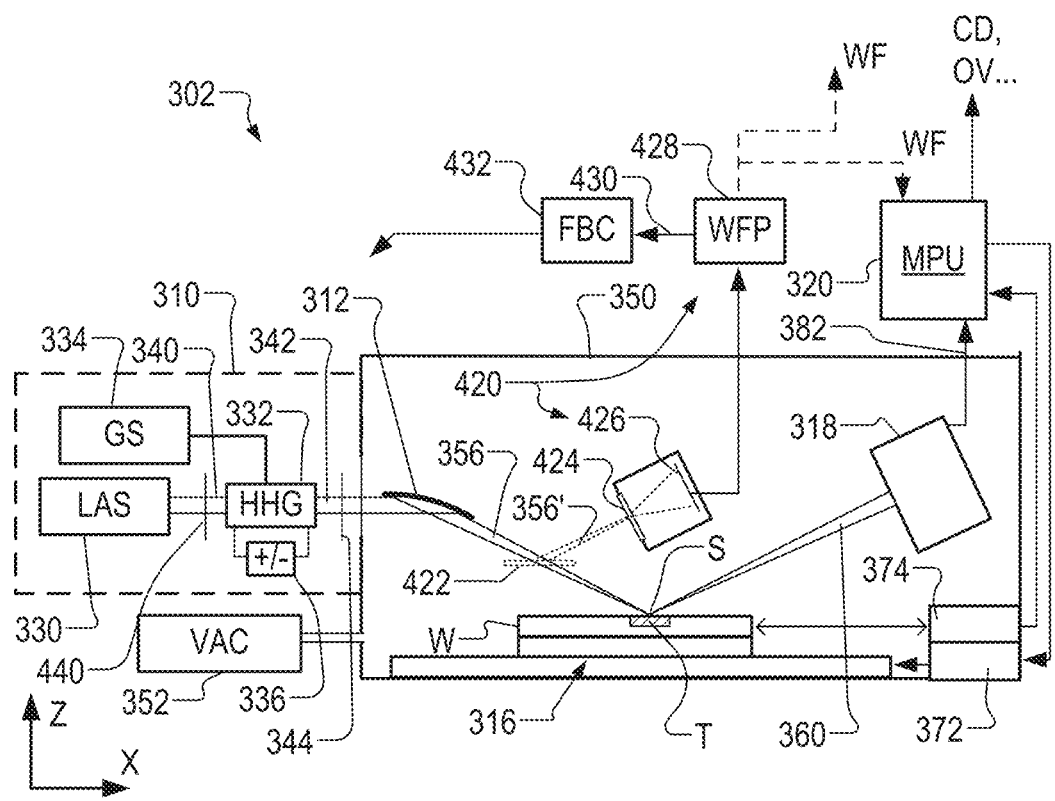
FIG. 2 shows schematically the arrangement of components in a first embodiment of an inspection apparatus including a radiation source arrangement and a wavefront sensor in which the present invention may be applied.

FIG. 2 illustrates a schematic physical arrangement of an inspection apparatus 302 comprising a spectroscopic scatterometer using EUV/SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths. Inspection apparatus 302 comprises a radiation source 310, illumination system 312, substrate support 316, detection system 318 and metrology processing unit (MPU) 320. Source 310 in this example comprises a generator of EUV or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser may be for example a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases can all be considered, either singly or in mixtures. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example, a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example, different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. One or more wavelengths in the range 1-20 nm or 1-10 nm may be chosen, for example. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection by substrate support 316. The structure of interest is labeled T. The atmosphere within inspection chamber 350 is maintained near vacuum by vacuum pump 352, so that EUV radiation can pass with-out undue attenuation through the atmosphere. The illumination system 312 has the function of focusing the radiation into a focused beam 356, and may comprise for example a two-dimensionally curved mirror, or a series of one-dimensionally curved mirrors, as described in international application number PCT/EP2016/080058, mentioned above. The focusing is performed to achieve a round or elliptical spot S less than 10 µm in diameter, when projected onto the structure of interest. Substrate support 316 comprises for example an X-Y translation stage and a rotation stage, by which any part of the substrate W can be brought to the focal point of beam to in a desired orientation. Thus, the radiation spot S is formed on the structure of interest.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an SXR spectroscopic reflectometer of the kind described in US2016282282A1. Tilting of the substrate in one or more dimensions may also be provided.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage and rotation stages. Metrology processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses SXR radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The SXR radiation may for example have wavelengths less than 100 nm, for example using radiation in the range 5-30 nm. The radiation may be narrowband or broadband in character.

Like the optical scatterometer used in today's production facilities, the inspection apparatus 302 can be used to measure structures within the resist material treated within the litho cell (known as After Develop Inspection or ADI), and/or to measure structures after they have been formed in harder material (known as After Etch Inspection or AEI). For example, substrates may be inspected using metrology apparatus 302 after they have been processed by the developing apparatus 112, etching apparatus 122, annealing apparatus 124 and/or other apparatus 126.

Figure 3:
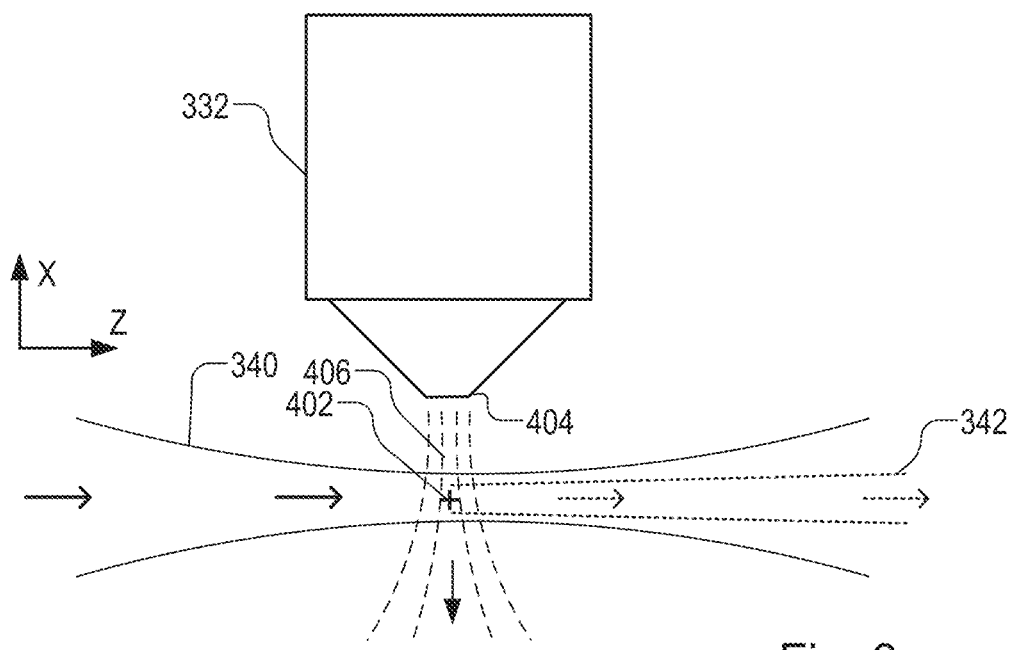
FIG. 3 shows a zone of interaction between first radiation and an HHG medium in an example radiation source arrangement.
Figure 4A:
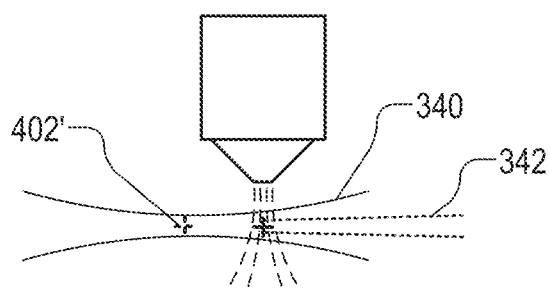
FIGS. 4(a)-4(d) illustrate some example deviations of operating conditions that can arise in the HHG radiation source arrangement.
Figure 4B:
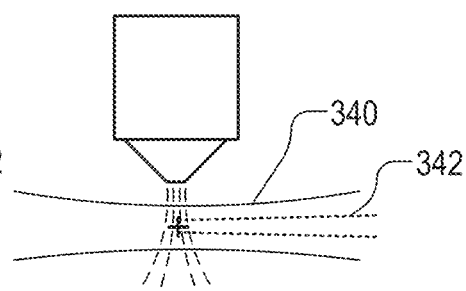
Figure 4C:
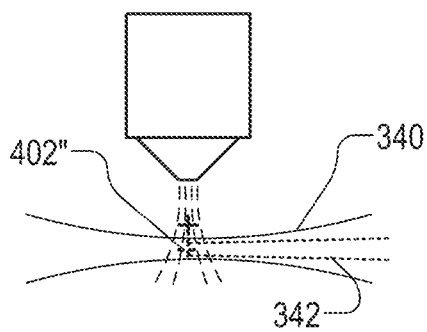
Figure 4D:
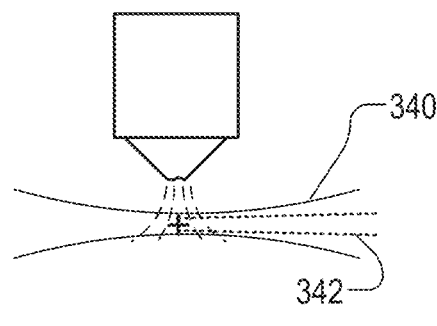

FIG. 3 shows the principle of operation of the Higher Harmonics Generation (HHG) source. In such a source, a high-power femtosecond pulsed IR laser (the drive laser 330) generates the first radiation beam 340. As indicated schematically by solid lines in FIG. 3, beam 340 is focused at a point 402 in the HHG generation space. A nozzle 404 emits a jet of gas 406 containing the Ne, Ar or other atoms which are to interact with the first radiation. Around the focus position, the large, oscillating electric field caused by the first radiation displaces electrons from the gas atoms. On recombination, an energetic photon is produced, synchronously with the pump radiation but with higher harmonic energy. This results in the beam 342 of second radiation (dotted lines). Since the SXR/EUV photons of interest have a very short penetration depth in any medium, the gas jet is located in a vacuum chamber that is constantly pumped to low pressure. In another type of HHG radiation source arrangement, the gas is confined together with the pump radiation within an elongated light guide. Principles of operation are the same in either case.

The application of inspection apparatus based on HHG radiation sources in a high-volume manufacturing facility requires a degree of control and stability of the HHG radiation source arrangement beyond that provided by the manual set-up procedures and short running times of existing sources. It may be expected that the characteristics like position, shape and size of the pump radiation focus with respect to the gas jet as well as the geometric shape, flowrate, pressure and stability of the gas jet itself are important parameters to create a high power, stable output of wanted radiation.

FIG. 4 illustrates schematically some deviations in the operating condition that may degrade the operation of the HHG radiation source arrangement. In FIG. 4(a) the pump radiation is focused at a point 402' displaced from the gas jet, leading to a loss of maximum amplitude of the electric field within the gas jet and consequently to possible failure/degradation of the HHG process. At (b) the pump radiation is imperfectly focused, leading again to a loss of maximum amplitude of the electric field. At (c), the pump radiation is focused at a point 402" within the gas jet, but displaced from the designed location 402. The form of the gas jet may be different at this point, leading to possible failure/degradation of the HHG process, and/or leading to the second radiation 342 being position incorrectly relative to the illumination system 312. At (d) the pump radiation is focused at the desired location, but the condition of the gas jet is degraded, for example due to a wrong pressure, or wear of the nozzle, again leading to possible failure/degradation of the HHG process. These four examples are only some of the deviations that can arise. Currently, most of the parameters mentioned above are adjusted by hand while evaluating the (wavelength dependent) intensity of the generated EUV light.

The present disclosure aims to enable the provision of a more industrially-applicable source arrangement, with automatic feedback loops to stabilize and optimize the EUV output. Wear conditions other than nozzle wear may also arise, including wear of optical components that are exposed to ions from the HHG process. Such components may include vacuum system entrance windows, and pump radiation focusing optics, if it is inside the vacuum. Other conditions that may be considered "wear" conditions include variations of the gas composition and gas purity. A controlled mixture of gases may be used, which varies over time, or impurities can accumulate, for example if the gas is recycled for economic reasons.

Referring again to FIG. 2, the present application proposes to provide one or more sensors for monitoring the operating condition of the HHG radiation source arrangement and the illumination system, by sensing a wavefront of the radiation beam 356 for a plurality of spectral components. Various embodiments will be described, each purely by way of example. In the illustrated example, wavefront sensor 420 receives at least a portion 356' of the focused beam 356 via a beam diverter 422. That is to say, the wavefront sensor in this example receives a portion of the second radiation 342 at a point that is downstream of a last focusing element in the illumination system 312. In this way the wavefront sensor can be used to obtain information about operating conditions in the HHG generation space, but also taking into account the properties of the illumination system 312. In other embodiments, the wavefront sensor may receive radiation 342 from upstream of a focusing element, or there may be no focusing element.

Beam diverter 422 may be a beam splitter which diverts a portion of the beam 356 to the sensor while a main portion of the beam continues to form the spot S on the target T. In this way, the wavefront sensor can operate continuously, simultaneously with measurements of the target. In other embodiments, beam diverter 422 may be a movable element which is placed intermittently in the path of the beam 356, so that the wavefront sensor operates only in between measurements of the target, and measurements of the target are conducted with minimal loss and disturbance of the second radiation 342. In the example where second radiation 342 has a wavelength in the SXR or EUV waveband, it will be understood that transmissive optical elements are difficult to provide. However, a beam splitter can be implemented as very thin multilayer device, or a very thin metal film. In the example of a movable element, a multilayer reflector may be envisaged, or even a metal surface.

Wavefront sensor 420 comprises some form of aperture array 424, arranged in the path of the radiation beam 356', and an image sensor 426 for capturing a 2-dimensional spot pattern created by the aperture array. A wavefront processor 428 receives from the image sensor 426 image signals (analog or digital data) representing the spot pattern, and derives wavefront information WF from the information of the spot pattern. One or more signals 430 (analog or digital data) representing operating conditions of the radiation source arrangement and illumination system may be produced.

As will be explained below, using a modified wavefront sensor disclosed herein, the wavefront information WF is both spectrally resolved and spatially resolved. The wavefront information can be used by a controller 432 to implement automatic feedback control loops for controlling the operation of the radiation source arrangement 310. Alternatively, or in addition, the signals representing operating conditions of the radiation source arrangement can be monitored for diagnostic purposes, for example to detect fault conditions of wear conditions, and to interrupt operation urgently, or to schedule maintenance operations. Alternatively, or in addition, the wavefront information can be used in the metrology processor 320 to influence the processing of the spectrum data 382 to produce more accurate measurements of parameters of interest. Other types of sensor can be used in addition, to provide further information about operating conditions.

Examples of operating parameters that can be controlled in the radiation source 310 will be described further below. As an example, FIG. 2 shows a compensatory optical device 440 for wavefront correction in the path of the first radiation 340 upstream of the HHG cell 332. European patent application no. 16188816.9 dated Sep. 14, 2016, not published at the present priority date, describes the correction of wavefronts to correct for a "slope error" of the illumination system 312 optical element(s) in an inspection apparatus, and therefore minimize blurring of the measurement spot. The European patent application describes embodiments in which calibration to correct this slope error is a one-time calibration: once the compensatory optical device is configured, it is not expected to require further adjustment. In such an embodiment, the calibration step may be performed only once during construction. In other embodiments, the calibration step may have to be repeated periodically. To allow real-time, closed-loop control of the wavefront, compensatory optical device 440 may be a programmable spatial light modulator (SLM). Needless to say, the real implementation of the beam delivery system may include several optical elements, and not a single lens as suggested in the simplified drawing. Note that the drawing suggests a transmissive SLM device purely for simplicity of illustration. Because of the power in the laser beam, the practical implementation may use a reflective type SLM (e.g. a digital micromirror device (DMD) array).

Wavefront Sensor Background

Figure 5:
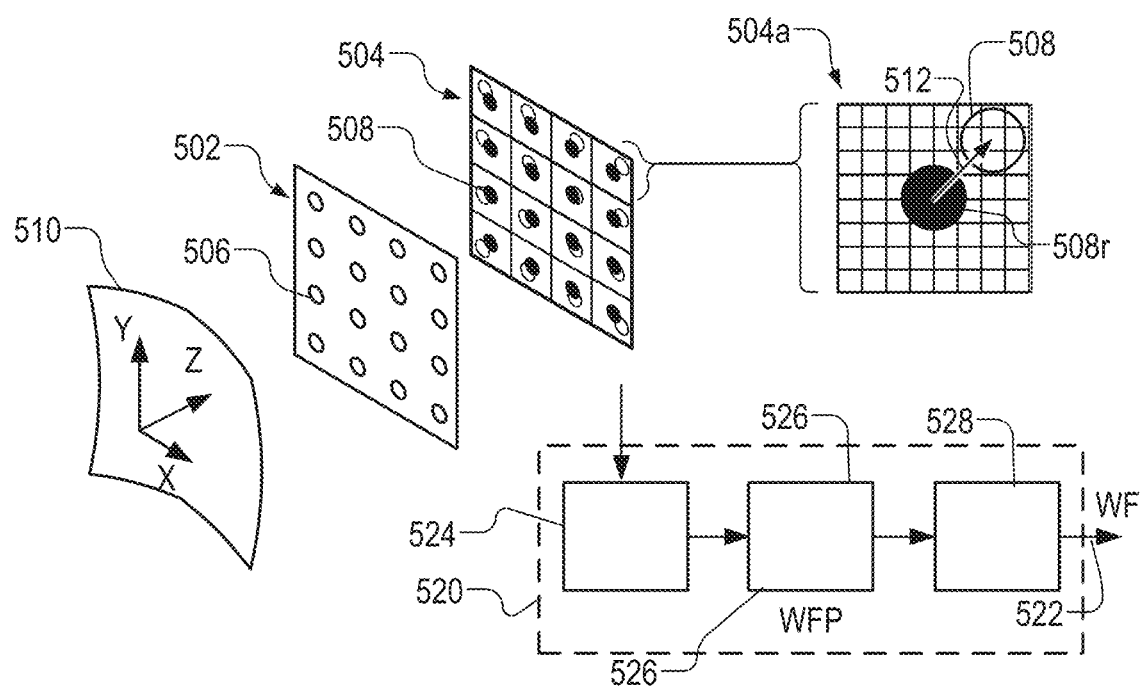
FIG. 5 illustrates the principle of operation of a known Hartmann-type wavefront sensor without spectral resolution.

FIG. 5 shows the principle of operation of a conventional Hartmann type wavefront sensor (without spectral resolution). An aperture array 502 is positioned in the path of a beam of radiation, and an image sensor 504, for example a CCD or CMOS image sensor. Aperture array 502 comprises for example a metal plate with apertures 506 spaced in a regular array in a plane defined by dimensions X and Y. Radiation approaching the wavefront sensor nominally in the Z direction passes through the aperture array and so forms an array of spots 508 on the image sensor 504, also oriented in an X-Y plane. If the beam of radiation had an ideal flat wavefront, so that it comprised only parallel rays perfectly in phase and perfectly aligned with the Z axis, each spot would be formed exactly behind the corresponding aperture 506. A real beam, on the other hand, will have some form of tilt and/or curvature, such as the convex wavefront 510 illustrated in the drawing. In that case, the wavefront is tilted in a particular way at each location in the aperture array and the corresponding spot 508 will be formed on the image sensor 504 with a positional deviation dependent on that tilt. Relative positional deviations can be observed and measured, even when an absolute "zero deviation" position of the sots is no known.

An enlarged portion of image sensor 504 is shown at 504a, showing one spot 508 (open circle) and also showing a reference position 508r (solid circle) for the same spot. Image sensor 504 comprises an array of photodetector elements (pixels) having sufficient spatial resolution (sufficient pixel density) that the deviation 512 of the actual spot 508 from the reference position 508r can be detected and quantified in two dimensions, for each aperture 506 of the aperture array. A wavefront processor 520 receives image data from the image sensor 504 and outputs wavefront information 522. Wavefront processor 520 will typically be implemented by programming a suitable programmable processor, and may operate for example in a number of stages. A first processing stage 524 analyzes an image from image sensor 504 to detect the positions of the spots 508. A second stage 526 compares the positions of the spots 508 with their reference positions 508r to determine a local tilt for the wavefront 510 at each location in the aperture array. The third stage 528 integrates and interpolates the array of local tilts to obtain a model of the entire wavefront. This wavefront model can be output as an example of wavefront information. It may be represented as an array of local tilt vectors, and/or as a parameterized model, for example using Zernike or other polynomial representations.

Figure 6:
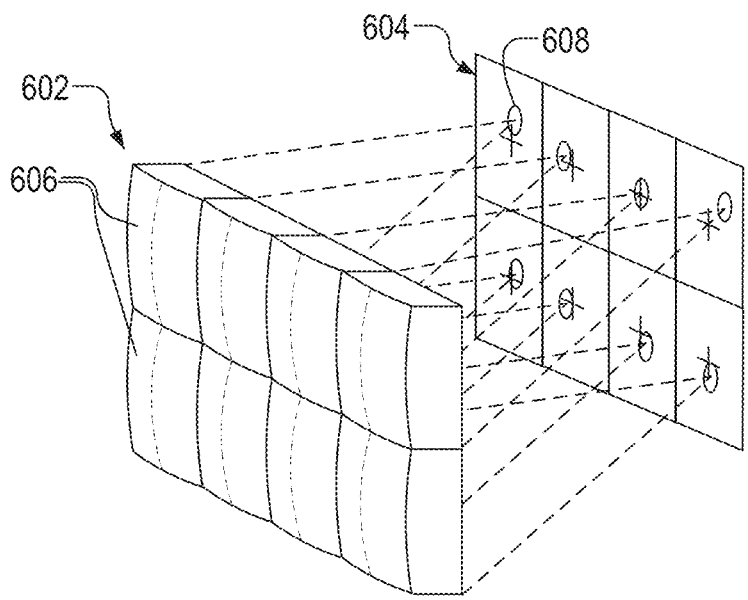
FIG. 6 illustrates the principle of operation of a known Shack Hartmann-type wavefront sensor without spectral resolution.

FIG. 6 illustrates part of a known Shack-Hartmann wavefront sensor. This operates on exactly the same principles as the Hartmann sensor shown in FIG. 5, and like parts have like reference numbers, only with prefix '6' instead of prefix '5'. The main difference in the Shack-Hartmann sensor is that an array 602 of focusing elements such as miniature lenses 606 (lenslets or microlenses) is provided, instead of an array of simple apertures 606. The main benefit is to improve the amount of light captured, and so to enhance the intensity of the spots 608 on the image sensor 604. The local wavefront tilt detected by the spot position becomes the average of the tilt across the area of the focusing element, rather than at one small aperture. It is assumed that the wavefront is relatively smooth on the scale of the array.

It should be noted that that, while the aperture array 502 shown in FIG. 5 is implemented by an array of actual apertures, transmitting radiation as illustrated, the same function could be implemented by an array of reflective spots, reflecting radiation locally. Either implementation is valid for the present disclosure, though each will bring its own practical benefits and challenges in implementation. Similarly, an array 602 of focusing elements 606 may be conventionally implemented by transmissive lenslets, but could also be implemented by one or more shaped reflective surfaces. Focusing by diffraction (using Fresnel zone plates, either reflective or transmissive) is yet another option, in principle. The reflective options could be more practical if such a wavefront sensor is to be designed for EUV/SXR wavelengths, where refractive elements are not readily available.

Another point to note about the conventional wavefront sensors is that they use monochrome image sensors 504, 604. Therefore, there is no resolution of different spectral components that may have different wavefront shapes. Prior attempts to add spectral resolution do so only at the expense of reduced spatial resolution, and are not compatible with all wavelengths, such as the EUV and SXR wavelengths.

Wavefront Sensor with Spectral Resolution

As mentioned above, in accordance with the present disclosure, there is provided a modified wavefront sensor, which may be used to obtain spectrally resolved wavefront information. The modified wavefront sensor may be used for example as the wavefront sensor 420 for controlling a radiation source apparatus, and/or may be used for measuring wavefronts in an inspection apparatus, for example for metrology using SXR wavelengths. The principles of the modified wavefront sensor are not limited to those applications, or to those wavelengths, however, and can be applied in other applications and wavebands. Nevertheless, the modified wavefront sensor brings particular advantages in those applications, and an example of the modified wavefront sensor will be described in that context.

In accordance with the principles of the present disclosure, the modified wavefront sensor 420 is adapted for at least intermittently measuring a tilt of a wavefront at an array of locations across a beam of radiation. The modified wavefront sensor is provided with a dispersive element at each location in said array, and is arranged to measure a wavefront tilt for each of a plurality of spectral components at each location in said array. To achieve this, the aperture array 502/602 is modified, and processing by the wavefront processor 520 is modified, as will now be illustrated and described.

Figure 7:
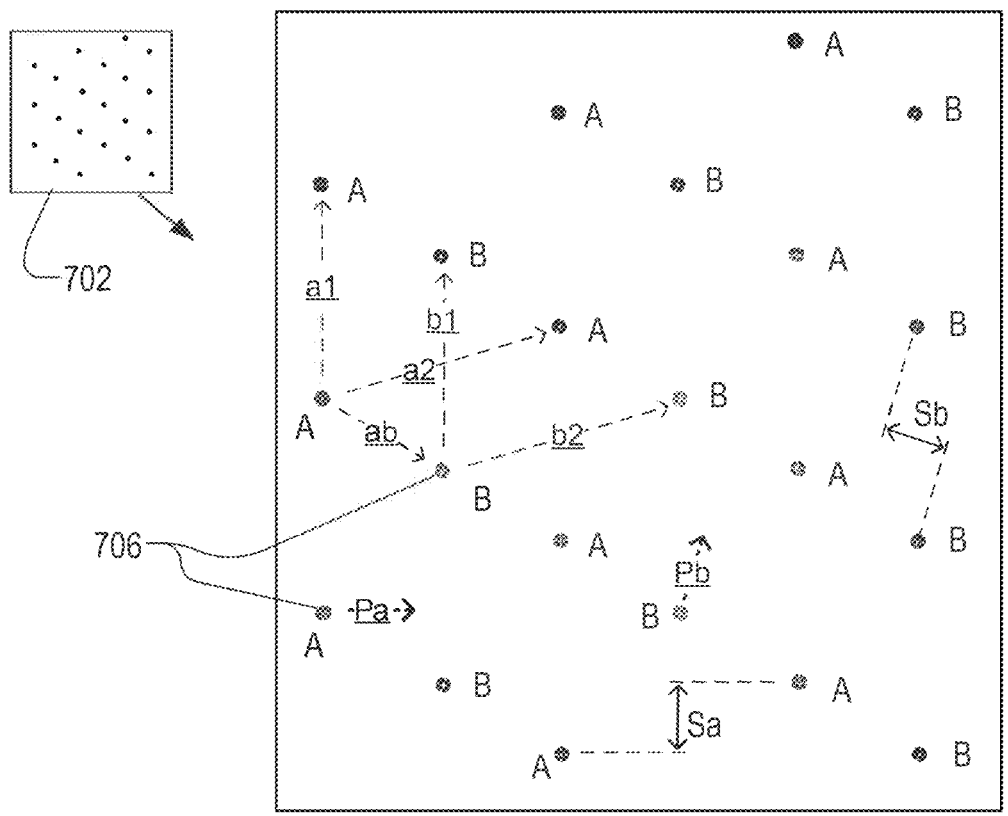
FIG. 7 is a micrograph of an array of apertures with dispersive elements for use in a modified Hartmann wavefront sensor according to an embodiment of the present disclosure.

FIG. 7 is a micrograph of an array of apertures with dispersive elements for use in a modified Hartmann wavefront sensor according to an embodiment of the present disclosure. The aperture array 702 is defined by a mask with apertures 706, and each aperture 706 contains a transmission grating structure. The structure in this example consists of a set of 20 μm diameter apertures milled into a metal-coated membrane (which is opaque to EUV). The sizes of the apertures are a matter of design choice.

The aperture array in this example is defined by two interleaved subsets of aperture locations, labeled A and B. The reason for dividing the array of locations into subsets of locations will be explained further below. The number of subsets can be one, two, or more than two if desired. Each subset of apertures is arrayed on a two-dimensional grid defined by two-dimensional spacing vectors a1, a2 and b1, b2 respectively. An interleaving spacing vector ab defines the offset between the two grids. It will be noted that the spacing vectors for each grid are not parallel, nor are they orthogonal. Other arrangements are permissible, without departing from the principles of the present disclosure.

Figures 8A, 8B:
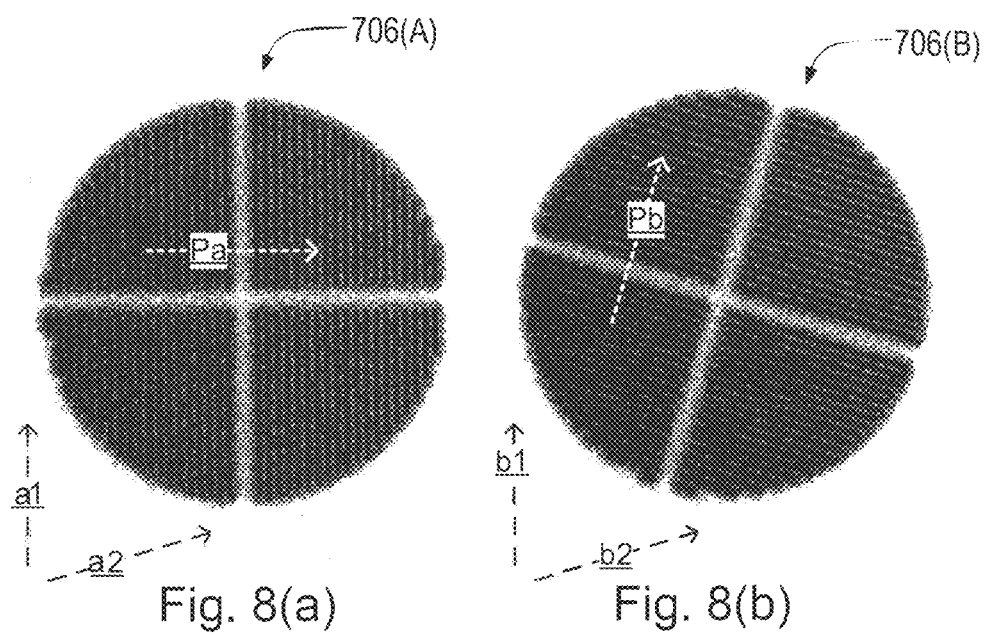
FIGS. 8(a)-8(b) show enlarged details of apertures with dispersive elements in two subsets (a) and (b) within the array of FIG. 7.

FIG. 8(a) shows in more detail the grating structure in an aperture 706(A) belonging to subset A of the array locations, while FIG. 8(b) shows an aperture 706(B) in the subset B. As can be seen, each grating structure fills its aperture with a grating of (transmissive) lines and (opaque) spaces. Each grating structure has a direction of periodicity, and the difference between the subsets A and B is that the direction of periodicity for the subset A, indicated by grating vector Pa, is different to the direction of periodicity for subset B, indicated by grating vector Pb. The pitch of the grating structures is such that a reasonable number of grating lines fall within the size of the aperture 706. In the example shown in the drawings, the pitch of the grating structure is 0.5 μm. The pitch is the same for both subsets, but could in principle be different.

The grating vectors Pa and Pb are shown also in FIG. 7. It will be seen that each grating vector is at an oblique angle to the spacing vectors of the corresponding subset of locations in the aperture array 702. The skilled reader will know that a grating structure acts to disperse radiation of different wavelengths (different spectral components) in different directions. The directions of the different spectral components are spaced along dispersion direction. The grating vector defines also the direction of dispersion. Also marked in FIG. 7 are spacings Sa and Sb. These show the minimum separation of the locations in that subset of the array of locations, measured in a direction transverse to the dispersion direction defined by the grating vectors in that subset.

The grating structures are an example of a dispersive element. In principle, refractive dispersive elements such as prisms could also be envisaged. The aperture array and dispersive elements can be provided as reflective elements, instead of the transmissive elements shown. In an embodiment based on the Shack-Hartmann sensor, dispersive elements will be large enough to cover the area of the focusing element. They can be formed as part of the focusing elements, if desired, or applied as a separate component. They can be arranged in different subsets if desired. The present disclosure does not exclude the possibility of another subset of locations being provided without dispersive elements, or with dispersive elements provided for a different purpose. The language of the introduction and claims should not be interpreted to exclude the provision of other aperture locations lacking dispersive elements, or having dispersive elements for a different purpose. Moreover, the language of the introduction and claims does not require that the same plurality of spectral components are measured within each subset of locations. In short, the language of the introduction and claims does not exclude implementations where wavefront tilts for different pluralities of spectral components are measured at different locations in the array of locations. The language of the introduction and claims does not exclude implementations where another array of locations are provided at which wavefront tilts are detected in the conventional manner, without spectral resolution.

Figure 9:
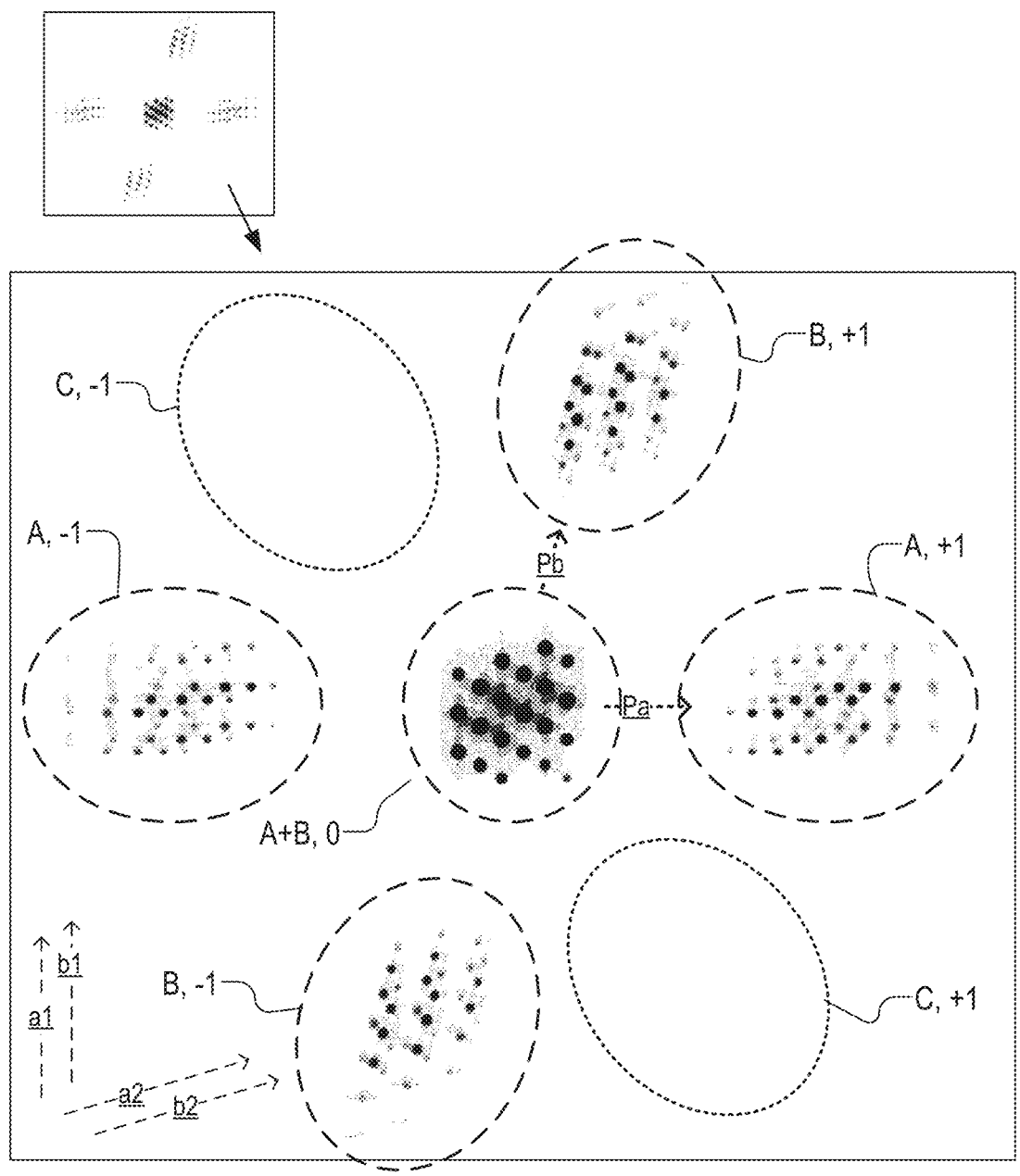
FIG. 9 shows a diffraction image captured in a modified Hartmann wavefront sensor using the array of apertures shown in FIGS. 7 and 8.
Figure 10:
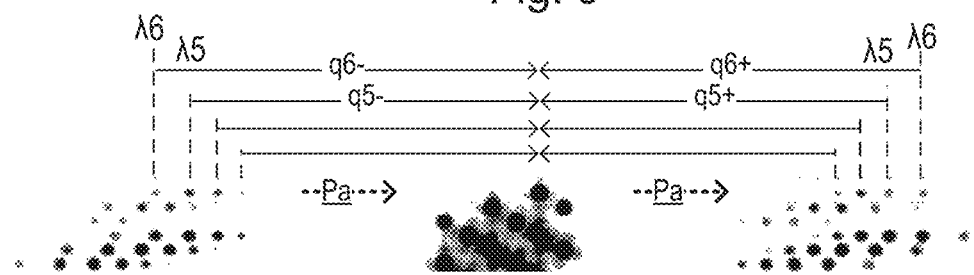
FIG. 10 shows an enlarged detail of part of the diffraction image of FIG. 9, showing the calculation of wavefront tilt for a plurality of spectral components at one location in the array.

FIG. 9 shows a spot image captured by an image sensor in the modified wavefront sensor using aperture array 702 in a beam of radiation from an HHG source such as the radiation source 310 shown in FIG. 2. FIG. 10 shows an enlarged portion of the image. The image of FIGS. 9 and 10 results from a single 1 second exposure, encompassing 300 pulses of a HHG radiation beam produced in Argon gas, using 800 nm wavelength laser radiation. The resulting EUV spectrum contains spectral components mainly ranging from 25 to 45 nm. With some improvements even single-pulse detection is feasible, providing full 2-D wavefronts and position-resolved spectra in millisecond acquisition times. Such a fast measurement can be exploited in a feedback scheme to stabilize HHG focal spot parameters in a metrology measurement. Alternatively, a parallel measurement of these parameters can be used to improve wafer metrology measurements through post-processing.

The HHG source generates radiation with a number of spectral components, predominantly higher harmonics of the pump radiation 340. The captured image shows a conventional Hartmann mask spot pattern in the center region labeled (0), but in addition shows spot patterns for each of the +1st and $-1^{st}$ diffraction orders for each aperture. From the subset A of apertures, diffraction orders are found in the regions labeled (A, −1) and (A, +1). These spot patterns consist of an array of spots, each of which corresponds to one harmonic wavelength (spectral component) in the radiation, spread in the dispersion direction defined by the grating vector Pa. Similarly, from the subset B of apertures, diffraction orders are found in the regions labeled (B, −1) and (B, +1). The spots corresponding to the different spectral components are spread in the dispersion direction defined by the grating vector Pb.

It will be seen how the spacing Sa ensures that the spectral components of the different apertures in subset A do not clash and are spatially separated in the image. Similarly, the spacing Sb ensures that the spectral components of the different apertures in subset B do not clash. The division of the apertures into subsets with different dispersion directions provides greater spatial separation that would be possible with a single dispersion direction, thereby allowing a greater spatial resolution of the aperture array as a whole. Additional subsets can be added to extend this principle. For example, a third subset could easily be added to make use of the "empty" space in the regions labeled (C, −1) and (C,+1) in FIG. 9.

It will be noted that the pitch of the grating structures has been chosen so that only first order diffraction is captured on the image sensor, for the subset of higher harmonics typically generated in a particular HHG radiation source arrangement. Further higher orders can be captured by suitable design, if desired. Depending on the spectral content of the radiation, the distributions of first and second order spots may be overlapping. The image sensor in this example may be only a few millimeters behind the aperture array, leading to a very compact design of wavefront sensor. The grating structure inside the apertures can be designed to suppress the diffraction from the apertures, for example using aperiodic gratings near the edge or additional structures just outside the apertures.

Now, the central spot pattern (A+B, 0) combines, into each spot, all the spectral components of the radiation at the corresponding location in the aperture array. Wavefront tilt per spectral component cannot be obtained here. However, in the outer regions where the higher diffraction orders are dispersed into separate spots, these separate spots can be found and their positions measured individually. A simple adaptation can be applied in the processing stage 524 of the wavefront sensor, mentioned above in FIG. 5. In fact, a variety of methods can be considered to make this adaptation, and one example will be described, without excluding other methods.

FIG. 10 shows an enlarged detail of part of the diffraction image of FIG. 9, showing the calculation of wavefront tilt for a plurality of spectral components at one location in the array. A series of spots in the captured diffraction image correspond to a series of expected wavelengths $\lambda 1$, $\lambda 2$, etc. Wavelengths $\lambda 5$ and $\lambda 6$, for example, are highlighted for one aperture in FIG. 10. Diffraction causes the $+1^{st}$ order spot for wavelength $\lambda 5$ to be displaced by an amount q5+ relative to a zero order position for that wavelength, while the $-1^{st}$ order spot for wavelength $\lambda 5$ is displaced by an amount q5− relative to the zero order position. Since the zero order spots are all overlaid and indistinguishable in the monochrome captured image, their positions cannot be measured directly, but their positions can be inferred from the positions of the higher (e.g. first) order spots. This is the function of the modified step processing stage 324.

In an example, the two $+1^{st}$ and $-1^{st}$ order spots for wavelength $\lambda 5$ are identified, and their positions are measured, for example by fitting a 2-D Gaussian profile to the image in the expected vicinity of each spot. A center of gravity of these two positions is then calculated and used as an overall position for wavelength $\lambda 5$. The deviation of this overall position from a reference position can be used to measured wavefront tilt for the wavelength $\lambda 5$ at this aperture location. Similarly, by recognizing and measuring the positions of spots for the different wavelengths, $\lambda 1$ through $\lambda 5$, $\lambda 6$ etc., separate measurements of wavefront tilt can be obtained for each spectral component (wavelength), and the same for each location in the aperture array. In one implementation, reference positions for each higher order spot are calculated and compared with the observed position, to obtain a deviation for each order. The deviations for the + and − orders are then combined (e.g. averaged) to obtain the deviation representing the wavefront tilt for that spectral component. Alternatively, as mentioned above, the center of gravity (average) position could be calculated and then compared with a reference position for the center of gravity.

The relationship between diffraction angle and position on the image sensor need not be symmetrical. Provided the geometry is known, suitable transformations can be applied to calculate the expect positions and deviations of the diffraction orders. As will be explained further below with reference to FIGS. 12 and 13, the calculation of wavefront tilt per spectral component need not be a simple center of gravity calculation. An enhanced calculation can be used which takes account distortion of the diffraction pattern as the tilt angle increases, and/or distortion caused by misalignment of components within the wavefront sensor. Additionally, while the above method works well for discontinuous spectra with known spectral components (such as harmonics), further enhancements can be applied to measure wavefront tilt across continuous or quasi-continuous spectra. These enhancements will be described below with reference to FIGS. 14 and 15.

Measuring the average or center of gravity of opposite orders is not essential. In other implementations, only one higher order spot is measured for each spectral component, for example the +$1^{st}$ order spot or the −$1^{st}$ order spot. The reference position for that spot is defined by calculation and/or prior calibration. The deviation of this one spot is used directly to determine the wavefront tilt. The positions of the spots can be the position of the spot. While using opposite orders and calculating a center of gravity can reduce the influence of noise in the measurement, by statistically averaging two measurements, use of only one order is also possible. For example, a "blazed" grating is a well-known variety of diffraction grating that suppresses one diffraction order and concentrates the diffracted radiation into only the other order, say + or −. By using blazed gratings, such that one diffraction order is suppressed, one could arrange a denser packing of the apertures in the aperture array, and hence increase spatial resolution. Such design choices are within the principles of the present disclosure. For example, if the diffraction spectrum is made one-sided by use of blazed gratings, different subsets of apertures could be provided with dispersion directions that are opposite to one another, so that the regions labeled "A,+1" and "A,−1" in FIG. 9 would actually correspond to different subsets of apertures.

The skilled person can decide which implementation is appropriate for their particular situation. A metrology tool and software can be designed to allow the particular implementation to be selected at the time of the measurement, as part of a metrology recipe. If the raw diffraction images are stored, different implementations can be run on the same data.

FIG. 11 shows results obtained in a real experiment, using the aperture array of FIGS. 7 and 8, and processing a captured diffraction image such as that shown in FIGS. 9 and 10. Each wavefront image (a) to (i) in FIG. 11 represents the wavefronts reconstructed from the wavefront tilts of one spectral component. The wavelength is written above the Figure labels, ranging from a spectral component (a) with 49.2 nm as the longest wavelength and a spectral component (i) with 25.4 nm at the shortest. A smooth wavefront model is fitted to the individual tilts measured for each aperture position. The result is illustrated as a fringe pattern, purely to aid visualization. Each transition from light to dark to light again represents a phase shift of a in the wavefront, representing an advancement or lag of the wavefront equal to a wavelength. The fringes become more numerous as the wavelength becomes shorter, as would be expected.

The monochrome fringe pattern does not show whether the wavefront is convex or concave, but the data behind the fringe patters shows that it is convex in each spectral component. Preliminary analysis indicates also that there is a wavelength-dependent variation in wavefront curvature, which would have significant implications on the shape and size of the focal spot. Therefore, real-time beam analysis seems like an important aspect for soft-X-ray wafer metrology. Note that the spatial dimensions of the apertures and the grating pitch can be chosen in such a way that the measurement is optimized for a given spectrum and central wavelength, and the above example only serves to illustrate the method. A useful design concept is to arrange that the grating diffraction is at far-field conditions, while the diffraction from the aperture remains limited. As mentioned, the simple apertures can be replaced by focusing elements, if desired.

FIG. 11(j) shows how the aperture array of FIG. 7 maps to the outline of the reconstructed wavefront images of FIG. 11(a) to (i). Each vertex of the striped areas represents one of the aperture locations. The aperture array is flipped and rotated slightly, relative to the micrograph in FIG. 7. An outlying location at top left (bottom right in FIGS. 7 to 9) is omitted from the calculation of wavefronts, because adequate diffraction orders are not captured in the diffraction image of FIG. 9.

Thus it is shown how, for each harmonic wavelength, using the center of mass of the two diffraction orders or another method, one can obtain measurement of the local wavefront tilt in two dimensions. This data suffices to extract a 2-D wavefront for each harmonic, from which also a focus size and shape and beam pointing information can be retrieved. Another property of the beam that can be quantified from the wavefront information in each spectral component is spatial coherence, which relates to the beam profile. A beam containing a single transverse mode is typically called "fully spatially coherent" (or "diffraction-limited"), whereas a beam containing multiple spatial modes tends to be called "partially coherent" since not all parts of the beam profile would interfere constructively when overlapped.

Modified wavefront sensor based on the above principles can be used also to measure other parameters of the spectral components. With knowledge of the dispersion characteristics (grating pitch) and the distance from the aperture array to the image sensor, each grating also acts as a transmission grating spectrometer, providing position-dependent spectra across the radiation beam.

Additionally, fitting a 2-D Gaussian filter to a spot in the captured diffraction image may reveal that the spot is not circular, but spreads into an ellipse in the dispersion direction. This spread can provide an indication of the bandwidth of that particular spectral component, and spectral broadening phenomena that may be at work in the radiation source arrangement.

Similarly, while a shift of the center of gravity of two opposite diffraction orders indicates wavefront tilt, an increase or decrease of the spacing between them (e.g. a lengthening or shortening of distance q5− and q5+ in FIG. 10) can be used as a measure of frequency shift of the spectral component. If only a single-sided measurement is made, it may be ambiguous as to whether a wavefront tilt or a spectral shift is the cause of a positional deviation of the spot. The designer of a particular implementation can decide whether this ambiguity is important or not, for the intended application.

The wavefront sensor 420 can be arranged also to calculate a measure of polarization in the radiation of the different spectral components. All of these different measurements, being made for multiple spectral components at multiple locations across the beam of radiation, provide increased diagnostic and control opportunities, compared with conventional sensors.

Figure 12A:
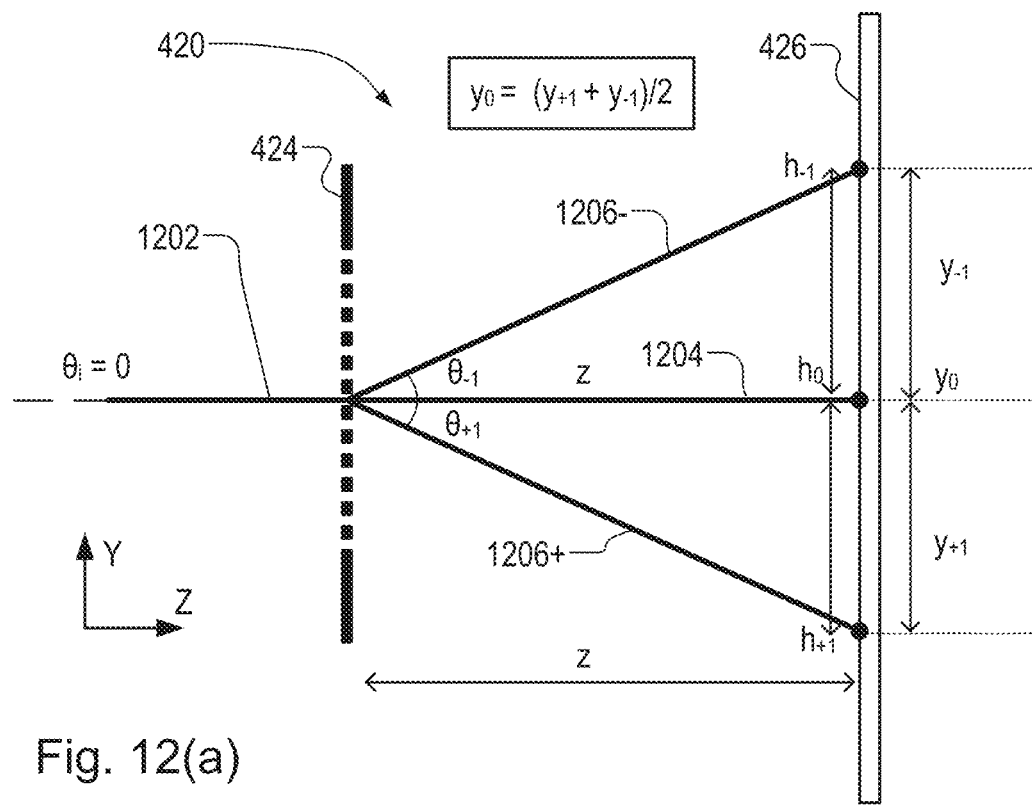
FIGS. 12(a)-12(c) illustrate 12(a) geometry of the wavefront sensor for a single wavelength with zero wavefront tilt, 12(b) geometry of the wavefront sensor for a single wavelength with non-zero wavefront tilt, and 12(c) geometry of the wavefront sensor for a single wavelength with non-zero wavefront tilt and misalignment of components within the sensor.
Figure 12B:
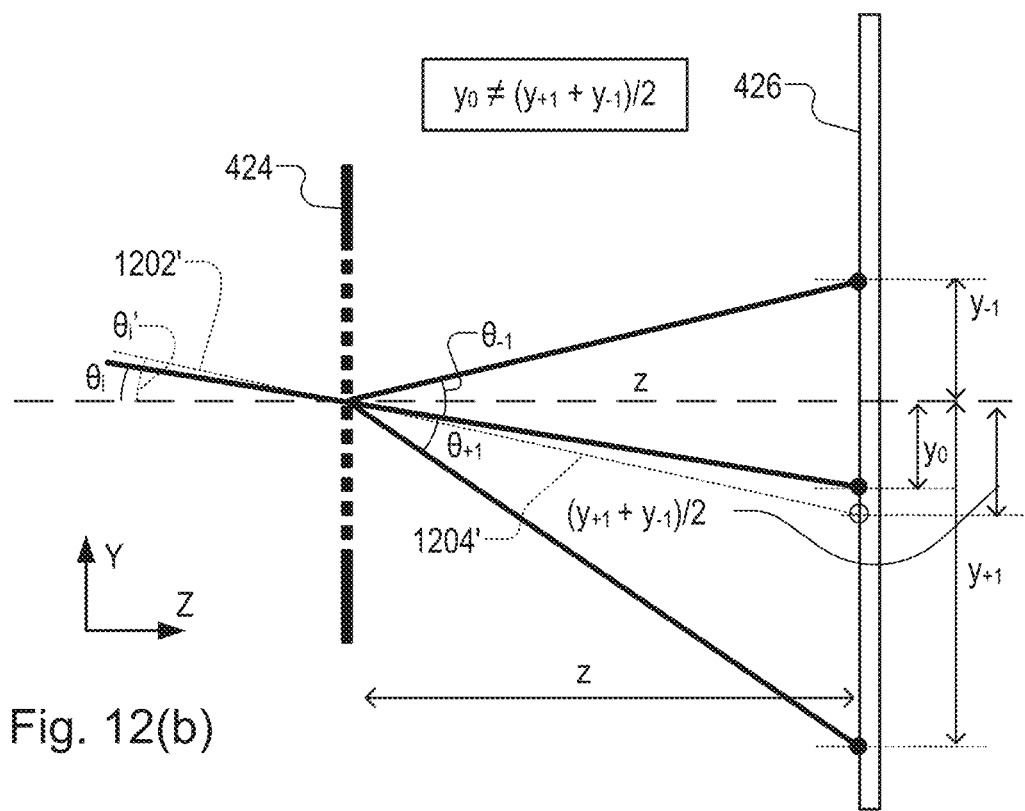
Figure 12C:
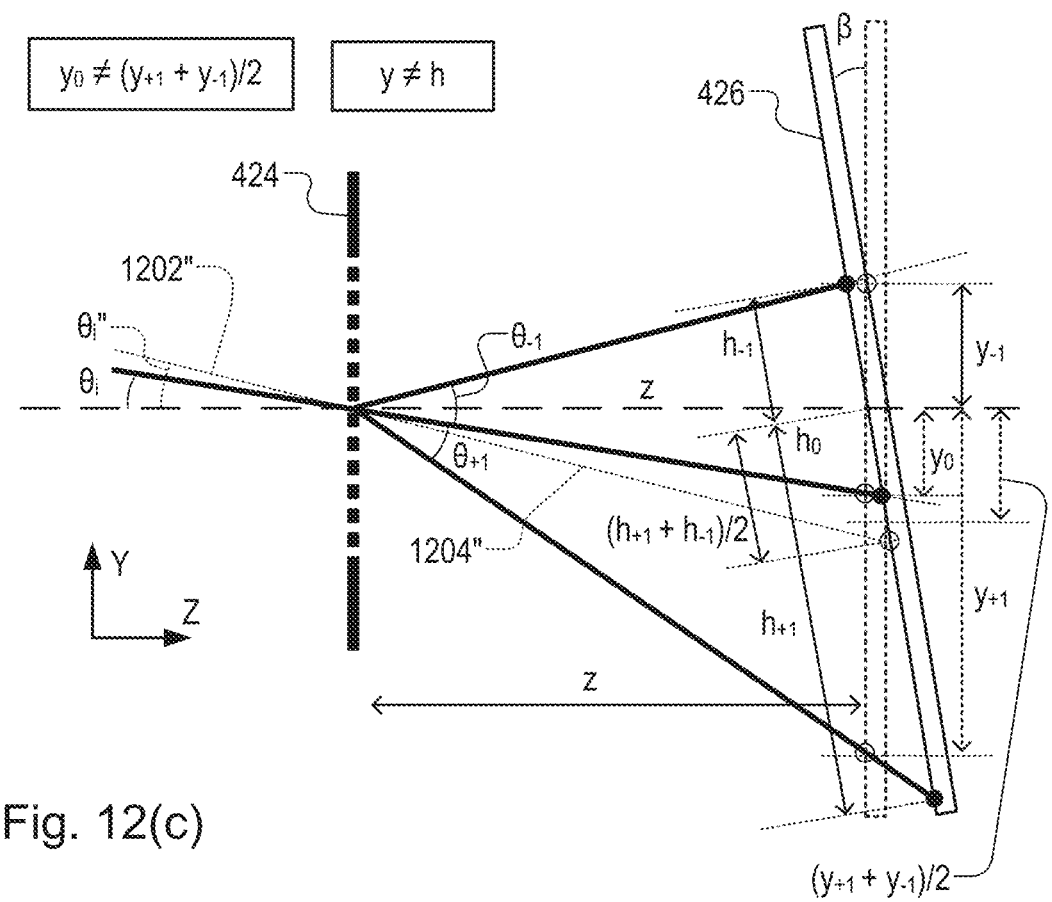

FIG. 12 illustrates (a) geometry of the wavefront sensor for a single wavelength with zero wavefront tilt. FIG. 12(b) illustrates geometry of the wavefront sensor for a single wavelength in the presence of non-zero wavefront tilt. FIG. 12(c) illustrates geometry of the wavefront sensor for a single wavelength in the presence of both wavefront tilt and misalignment of components within the sensor, which may arise in practice. As mentioned above, accuracy of the calculation of wavefront tilt for different spectral components and locations can be enhanced using an enhanced calculation that takes account of wavefront tilt and misalignment of components within the sensor.

In FIG. 12(a), one aperture of the aperture array 424 shown in cross-section, spaced by a distance z from image sensor 426. For simplicity, the cross-section shown is one looking along the X axis, while the dispersion direction for this particular aperture is parallel to the Y axis. Incoming radiation 1202 of a spectral component of the radiation of interest meets the grating in the aperture and is split into zero order beam 1204 and first order beams 1206+ and 1206−. The diffracted rays traverse the gap between the aperture array and the image sensor, and impinge upon the image sensor to be detected as spots of radiation forming a pattern of the type shown in FIGS. 9 and 10. The spots of radiation are detected at positions $h_{-1}$, $h_0$ and $h_{+1}$ on the images sensor, as shown.

In FIG. 12(a) the aperture array 424 and the image sensor 426 are perfectly parallel with one another, and the incoming radiation 1202 is perfectly aligned with the Z axis, corresponding to an angle of incidence $\theta_i=0$, that is zero tilt. The measured positions $h_{-1}$, $h_0$ and $h_{+1}$ correspond to positions $y_{-1}$, $y_0$ and $y_{+1}$, respectively. The position $y_0$ of the zero order beam can be calculated from the center of gravity of the first order spots, as described above, namely $y_0=(y_{+1}+y_{-1})/2$. (As explained above, the position $h_0$ or $y_0$ of the zero order beam for a single spectral component cannot be measured directly, because it is overlapping the zero order beams for all spectral components.)

Now, as shown in FIG. 12(b), the presence of a non-zero tilt with a non-zero angle of incidence $\theta_i$ causes the diffraction pattern to be distorted asymmetrically when it reaches the plane of the image sensor. In mathematical terms, if there is a nonzero angle between the incident beam and the wavefront sensor, the diffraction angle of the diffraction orders changes according to the grating equation:

$$\theta_m = \arcsin\left(\frac{m\lambda}{d} - \sin\theta_i\right) \quad (1)$$

in which m is the diffraction order and d is the pitch of the grating in the aperture. The position of the diffraction spot on the image sensor is then given by $y_m = z \tan(\theta_m)$. For a nonzero tilt $\theta_i$ the result is that the center of mass of the diffraction orders $(y_{+1}+y_{-1})/2$ is displaced from the $0^{th}$ order position $y_0$. In other words, the center of gravity of the spots, given by the expression $(y_{+1}+y_{-1})/2$, no longer represents accurately the position $y_0$ of the zero order spot. Using the center of gravity of the spots as a measure of wavefront tilt gives an inaccurate measure of wavefront tilt, represented by the dotted lines 1202' and 1204' with inaccurate incidence angle $\theta_i'$. For small angles, the inaccuracy will be small, and at least the general direction of tilt and relative magnitudes of tilt will still be represented correctly. Therefore, the simple center of gravity calculation may be sufficient for monitoring and control purposes. However, for greater accuracy, the calculation can be performed so as to correct for the distortion of the diffraction pattern, thereby to calculate the correct position $y_0$ and/or angle of tilt $\theta_i$ for each spectral component.

For an accurate calculation of wavefront tilt, other factors may need to be taken into account. FIG. 12(c) illustrates for example a situation where that the image sensor 426 is not perfectly aligned with a direction parallel to the aperture array 424. This misalignment is represented in the diagram by an angle of rotation β around the X axis. This angle β may be very small, but the wavefront tilts measured in the apparatus may also be very small, for example tens or hundreds of microrads. The effect of this misalignment, as shown in FIG. 12(b), is that the positions $h_{-1}$, $h_0$ and $h_{+1}$ measured on the image sensor no longer correspond linearly to positions $y_{-1}$, $y_0$ and $y_{+1}$ in the X-Y plane. In other words, the non-zero angle makes it more complicated to extract the wavefront tilt $\theta_i$ directly from the measured image. As shown by the dotted lines 1202" and 1204", and inaccurate incidence angle $\theta_i''$, in this case the center of gravity position that would be calculated from $(h_{+1}+h_{-1})/2$ is an even less accurate representation of the true zero order position $y_0$ and the true angle of tilt $\theta_i$.

In mathematical terms, the measured spot positions $h_{\pm1}$ are related to the 'true' positions $y_{\pm1}$ through a relationship:

$$h_{\pm1} = y_{\pm1}\frac{\cos\theta_{\pm1}}{\cos(\theta_{\pm1}\mp\beta)}.$$

This results in an expression for the incident angle:

$$\theta_i = \arcsin\left[\frac{\pm\lambda}{d} \pm \frac{h_{\pm1}^2\cos^2\beta}{\sqrt{h_{\pm1}^2\cos^2\beta(h_{\pm1}^2 + z^2 - 2zh_{\pm1}\sin\beta)}}\right] \quad (2)$$

This expression shows that it is not directly possible to determine the absolute tilt angle $\theta_i$ from a measurement without a precise calibration of β. In practice, such a calibration may be possible by performing a measurement using a known reference beam. Without calibration, however, tilts changing over time could still be detected, in addition to relative tilts between wavelengths at each location.

Note that this effect is only observed for a tilt in the plane of the dispersion direction. Accordingly, if the aperture array 424 contains gratings oriented in at least two distinct directions (as is the case for the example of FIG. 7-11), then a wavefront tilt can be detected by measuring the displacement between the center-of-mass positions of the +/− first diffraction orders for the different grating orientations. The sensor alignment effects (angle β) would only affect the subset of apertures having a dispersion direction aligned with the tilt direction, while relative tilt between the wavefronts at different locations and wavelengths should show up in both subsets. By comparing center-of-mass displacements between these subsets for all wavelengths, the effect of misalignment can therefore be separated from the wavefront tilts $\theta_i$. The gratings of the different subsets need not be oriented orthogonally to measure tilts in both x and y directions independently. The description of misalignment being aligned with the Y axis is only for a simple illustration. The analysis can be made general so that misalignment in any direction can be resolved into components aligned with any grating directions, and the then (if desired) transformed to any system of axes. As illustrated below and mentioned above, the number of different dispersion directions is not limited to two, and measurements from three or more differently-oriented subsets of apertures can be combined in practice.

If β is known from some other source, for example by a direct measurement of alignment, then taking the measured center-of-mass displacements vs. wavelength and fitting them to Equation (2) also yields the absolute tilt angle $\theta_i$.

Figure 13:
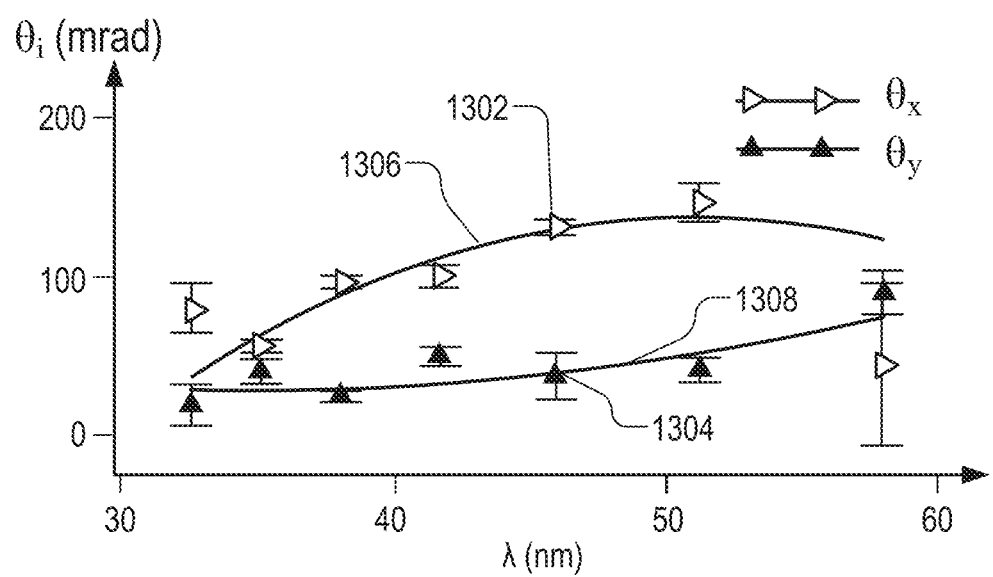
FIG. 13 illustrates measurements of wavefront tilt for an example HHG radiation source.

FIG. 13 shows an example of a tilt analysis for a real HHG beam. Wavefront tilt $\theta_i$ is expressed in two dimensions by components $\theta_x$ and $\theta_y$ (which may be referred to for example as "tilt" and "tip", respectively. Measurements were taken with the aperture array from FIG. 7, and then transformed from the dispersion directions Pa and Pb into proper the x and y coordinates. Samples 1302/1304 etc. represent measurements of tilt/tip for seven different spectral components (harmonics), ranging in wavelength between 30 and 60 nm. These components are measured by the technique just described, removing the effect of misalignment angles ($\beta_x$, $\beta_y$) by combining the signals from the two subsets of apertures. A curve 1306 is fitted to the tilt measurements 1302 and a curve 1308 is fitted to the tip measurements 1304. These results show that wavelength-dependent wavefront tilts can indeed be present in HHG beams, and can be measured in two dimensions at multiple locations across an HHG beam. It should be understood that the vertical scale in FIG. 13 has an arbitrary origin: the measurement in this example reveals relative tilts between spectral components, but not any absolute tilt. The longest wavelength samples (lowest harmonics) are seen to be poorly fitted to the curve. It is commonly the case that the lowest harmonics in HHG processes are subject to additional effects compared with the higher harmonics. This may explain the distribution shown. Further investigation can be undertaken if desired.

The above measurements of wavefront tilt and alignment can be performed with a single aperture or apertures, and/or at a number of locations separated spatially across and aperture array. While absolute tilts may not be measurable in all embodiments, the ability to measure relative tilts between different wavelengths and between locations provides a valuable diagnostic tool. Note that external calibration is not required, aside from a reasonable estimate of the sensor-camera distance z. If some knowledge about the spectrum is available (i.e. knowing at least two wavelengths, or the fact that harmonics are equally spaced in frequency) then z can also be determined from the measurement itself.

Figures 14A, 14B, 14C:
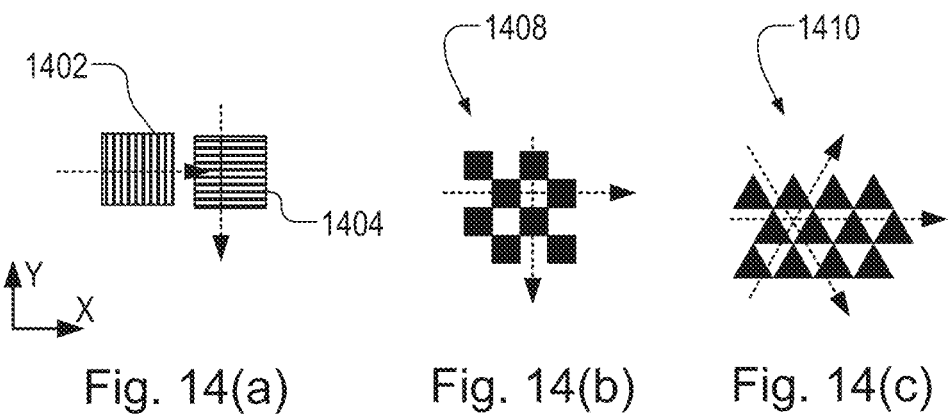
FIGS. 14(a)-14(c) illustrates three 2-dimensional aperture gratings 14(a), 14(b), 14(c), usable for measurement of wavefront for radiation with a continuous spectrum.
Figure 15:
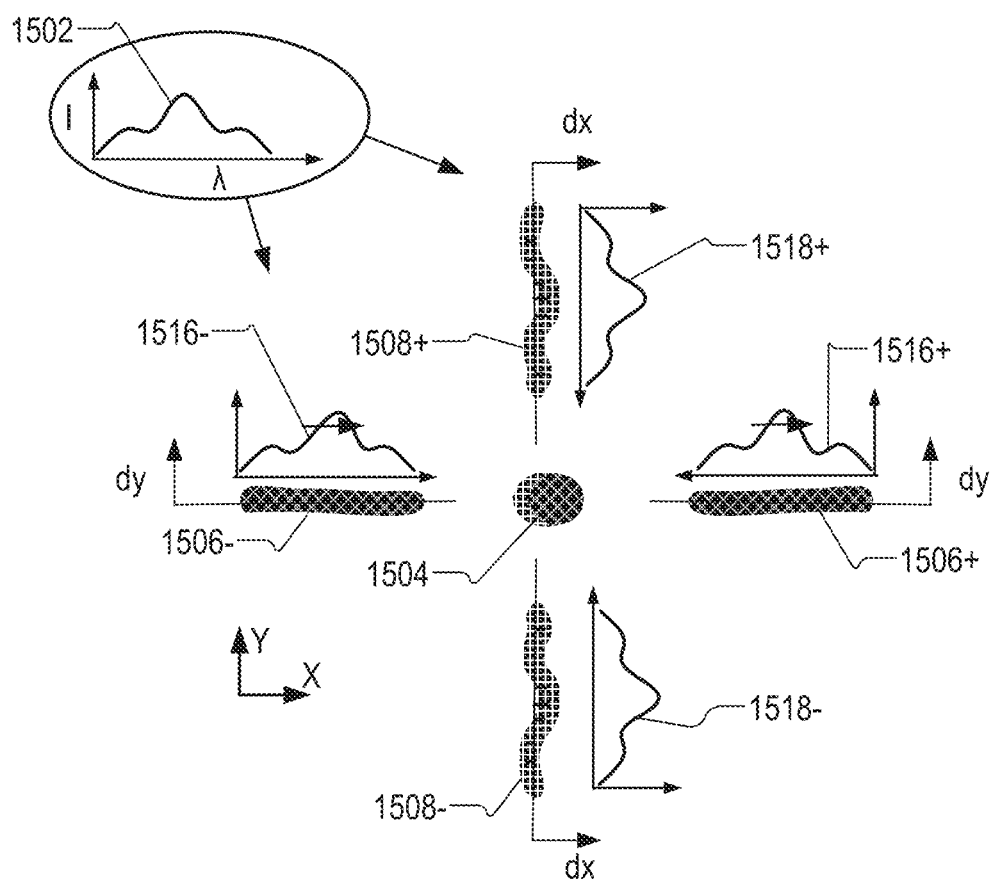
FIG. 15 illustrates the principles of measuring wavefronts for radiation with a continuous spectrum.
Figure 16:
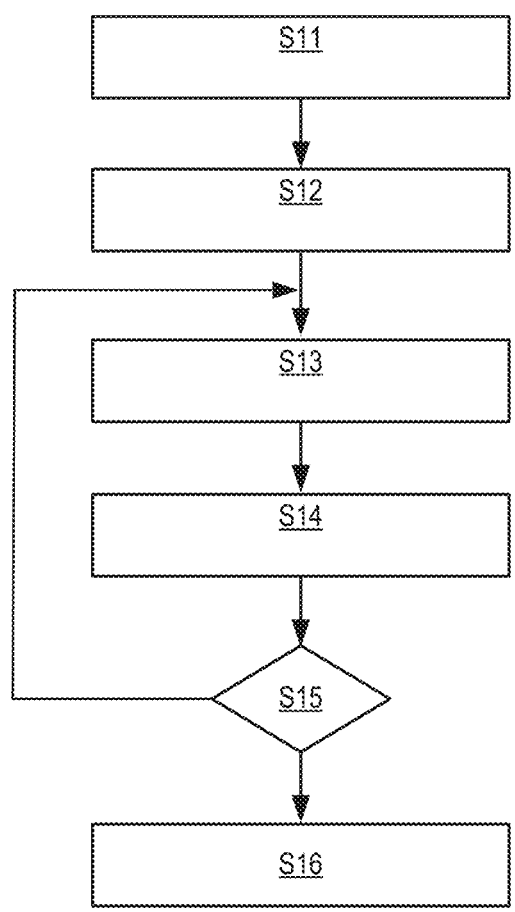
FIG. 16 illustrates an example procedure for determining wavefront tilts, based on the principles of FIGS. 14 and 15.

FIGS. 14 to 16 show how the techniques described above can be extended to continuous or quasi-continuous spectra, and not only spectra containing a series of discrete harmonics as spectral components. As will be understood, the spot pattern of FIG. 9 would become a series of "smears" or "stripes", if the radiation had a more continuous spectrum. The techniques based on recognition of diffraction spots would fail. Exploiting the presence of dispersive elements with different dispersion directions, however, wavelength-dependent wavefront tilts can be measured at multiple locations, even for such continuous spectra.

FIG. 14 illustrates various types of grating having two or more dispersion directions. Example (a) shows a cluster of two one-dimensional gratings, a first grating 1402 having a dispersion direction aligned with the X axis and a second grating 1404 having a dispersion direction aligned with the Y axis. The dispersion directions are indicated with dotted arrows. Example (b) shows part of a single two-dimensional grating 1408 having dispersion directions aligned with both the X and Y axes. Example (c) shows part of a single two-dimensional grating 1410 having three dispersion directions.

Gratings of the types shown in FIG. 14(a), (b) or (c) can be formed at locations across an aperture array 424 in a wavefront sensor 420 of the type generally described above. In some embodiments, clusters of two or more one-dimensional gratings can be positioned at each location in the aperture array. This can be arranged based on the aperture array 702 or FIG. 7, by moving the apertures of subset B until they are closer to the apertures of subset A. In other embodiments, as explained below, the subsets A and B can be left spaced out, as shown in FIG. 7, at the expense of spatial resolution. In other embodiments, a single two-dimensional grating (e.g. 1408 or 1410) can be arranged at each location. In principle, a cluster of two-dimensional gratings could be provided at each location, for further diversity of the dispersion directions.

FIG. 15 illustrates the principle of measuring a two-dimensional wavefront tilt for radiation of continuous spectrum. Inset at 1502 is a nominal spectrum for the radiation. Assume a pair of one-dimensional gratings 1402 and 1404 have been provided, as shown in FIG. 14(a). This forms effectively two apertures closely spaced in the aperture array 424. Zero order spots for these two apertures and all wavelengths will overlap on the image sensor at position 1504. From the X-oriented grating 1402, first order diffracted radiation will form stripes 1506– and 1506+ broadly to the left and right of the drawing, as shown. From the Y-oriented grating 1404, first order diffracted radiation will form stripes 1508– and 1508+ broadly to the bottom and top of the drawing, as shown.

Each stripe in the diffraction pattern has a unique distribution of intensity, and a unique transverse deviation, that depends on the tip and tilt angles of the wavefront in each part of the spectrum. In the illustrated example, it is assumed that the wavefront has a substantial wavefront dependent tilt in the X direction, and relatively little tilt (tip) in the Y direction for any wavelength. This situation gives rise to the following effects in the observed diffraction pattern. Firstly, as illustrated on the stripes 1506– and 1506+, these follow relatively straight lines, with little transverse deviation dy. On the other hand, the different tilts at different wavelengths cause distortion of the intensity profiles 1516– and 1516+, relative to the nominal spectrum 1502 of the radiation. Peaks and troughs in the spectrum may move to the left or right, compressing and expanding parts of the spectrum relative to the nominal spectrum. This distortion can be recognized when a spectrum is measured from the intensities of different parts of the stripe 1506–/1506+. This distortion will be opposite for the $+1^{st}$ and $-1^{st}$ diffraction orders, because a wavefront tilt causes both spots to move in the same direction (so to an apparent lower wavelength for one order and higher wavelength for the other).

Secondly, as illustrated on the stripes 1508− and 1508+, the tilt in the X direction causes a significant transverse deviation dx, which can be measured in both the + and − stripes. Intensity profiles 1518− and 1518+ correspond closely to the nominal spectrum 1502, because of the lack of Y tilt, and therefore the absence of distortion of the intensity profile relative to the spectrum of the radiation.

In other words, in the direction perpendicular to the local wavefront tilt, a displacement of parts of the line (transverse deviation) occurs. In the direction parallel to the tilt, the displacement of some spectral components will lead to an apparent distortion of the spectrum. As the true wavefront-corrected spectra should be the same for both diffraction orders, this effect also allows detection of the distortion caused by the spectral wavefront tilt. Because the distortion will be opposite for the $+1^{st}$ and $-1^{st}$ diffraction orders, it can be distinguished from any change in the spectrum of the radiation itself.

In conclusion, by detecting the combination of transverse displacements from the diffraction direction for one grating direction and a spectral distortion for the other direction, a local wavefront tilt can be identified. In general, of course, a two-dimensional wavefront tilts may have a component parallel to a dispersion direction and a component perpendicular to the dispersion direction of a given grating. In general, the dispersion directions can be chosen to be different from the X and Y axes, and need not be perpendicular to one another.

It will be understood that calculation of the wavefront tilts in the case of continuous spectra (stripes) is more complicated than in the case of spectra comprising a few isolated harmonics (spots). In one embodiment, it is proposed to reconstruct spectrally resolved wavefront tilts for each aperture by a numerical procedure.

FIG. 16 illustrates an example procedure and comprises steps S11 to S15, as follows:

S11: The approximate spectrum of the illumination is approximated by a large number of monochromatic probe beams with different wavelengths, intensities and wavefront tilts. The number of these probes can be adjusted to the light under investigation, being based on an approximate nominal spectrum.

S12: For each probe, an expected spot pattern is calculated from the diffraction of the mask. This yields a signature of the corresponding probe beam in the coordinates of the image sensor.

S13: Considering together the expected spot patterns for all the probe beams, a comparison can be made with the stripe pattern actually measured by the image sensor. The correlation between the expected spot patterns and the observed pattern yields a pixel-wise multiplier that reinforces those probe beam that match the measured data and discounts those that do not match.

S14: After multiplying the individual probes with their multipliers, an updated set of probe beams is used to update the wavefront and intensity at the aperture.

S15: Using the updated set of probe beams with modified intensity and wavefront, flow returns to step S13 to calculate new expected spot patterns in the field of the image sensor.

S16: After sufficient iterations, the parameters of the updated probe beam are reported as a measurement of the wavefront tilts.

Starting with step S11 and then iterating through steps S12 to S15 a number of times should converge to a reliable estimate of the wavefront tilts for all spectral components in the measured beam. This procedure can work with a wide range of sensor geometries and illuminations. The convergence of the algorithm will depend on a number of properties, such as the presence of orthogonal diffraction directions, knowledge of the illumination and presence of higher-order diffraction. The calculation can be made more robust and efficient by sharing learning between neighboring apertures, for example, and or between successive samples in time. This is based of course on the assumption that the wavefronts vary slowly over the beam, and/or over the time sampling interval.

As mentioned, the multi-directional gratings or grating clusters can be present in a layout that is similar to that presented in FIG. 7. The risk of overlapping diffraction patterns increases, however, so that the overall spectral resolution and spatial resolution may need to be reduced, to obtain information from radiation having a continuous or quasi-continuous spectrum. Multi-directional gratings or grating clusters need not be provided at every location. Gratings oriented in more than two diffraction directions, such as the triangular grating of FIG. 14(c) should improve the reconstruction of accurate wavefronts. In the case of grating clusters, the gratings with different orientations sample the wavefront at slightly different positions, as illustrated in FIG. 15. This is acceptable if the wavefront does not contain significant short-range variations. In cases where the wavefronts vary only over long ranges, clustering of the different orientations may be unnecessary, and a layout with subsets of gratings completely dispersed as in FIG. 7 can be used.

The method can include calibration of the distance z between the aperture array and the image sensor, but this is possible by illuminating the sensor with a known wavelength.

If higher diffraction orders ($+/-2^{nd}$ and higher) can also be detected then they can provide additional information that aids reconstruction, as the apparent spectral distortions caused by a local wavefront tilt are different for each order.

Having prior knowledge about the source spectrum helps the wavefront reconstruction as it allows comparison with the measured spectra at each aperture with this reference. Yet this prior knowledge is not essential for wavefront measurements, as the combination of identical spectra for $+/-1^{st}$ orders and the transverse displacements in another grating direction should suffice for a unique solution.

In summary, the techniques illustrated with the examples of FIGS. 14 and 15 can provide spectrally-resolved two-dimensional wavefront measurements from a single camera exposure, even for continuous, semi-continuous or in general complex spectra. Like the example of FIGS. 7 to 11, the method requires no scanning or swapping of filters, and so enables single pulse measurements. The method is also independent of calibration of spectral filters, which eliminates a possible source of systematic errors in other spectroscopic methods.

Application Examples

In any of the above examples, the spectrally resolved and spatially resolved information obtained from the modified wavefront sensor 420 can be used to monitor and/or adjust numerous parameters of the operating radiation source arrangement. Examples of parameters and conditions that can be monitored in real time (and adjusted automatically or manually) include:

1) Direction of the pump radiation
2) Positioning of the pump radiation focus

3) The wave front of the pump radiation (for example by modifying or reprogramming a Spatial Light Modulator 440)
4) Gas flow settings, nozzle shape and other gas jet parameters
5) Gas jet nozzle deterioration
6) Gas composition and purity Since the wavefront sensor in this example is positioned downstream of the focusing arrangement in the illumination system 312, parameters and conditions within the illumination system can be monitored, either separately, or as parameters of the radiation source and illumination system combination.

Figure 17:
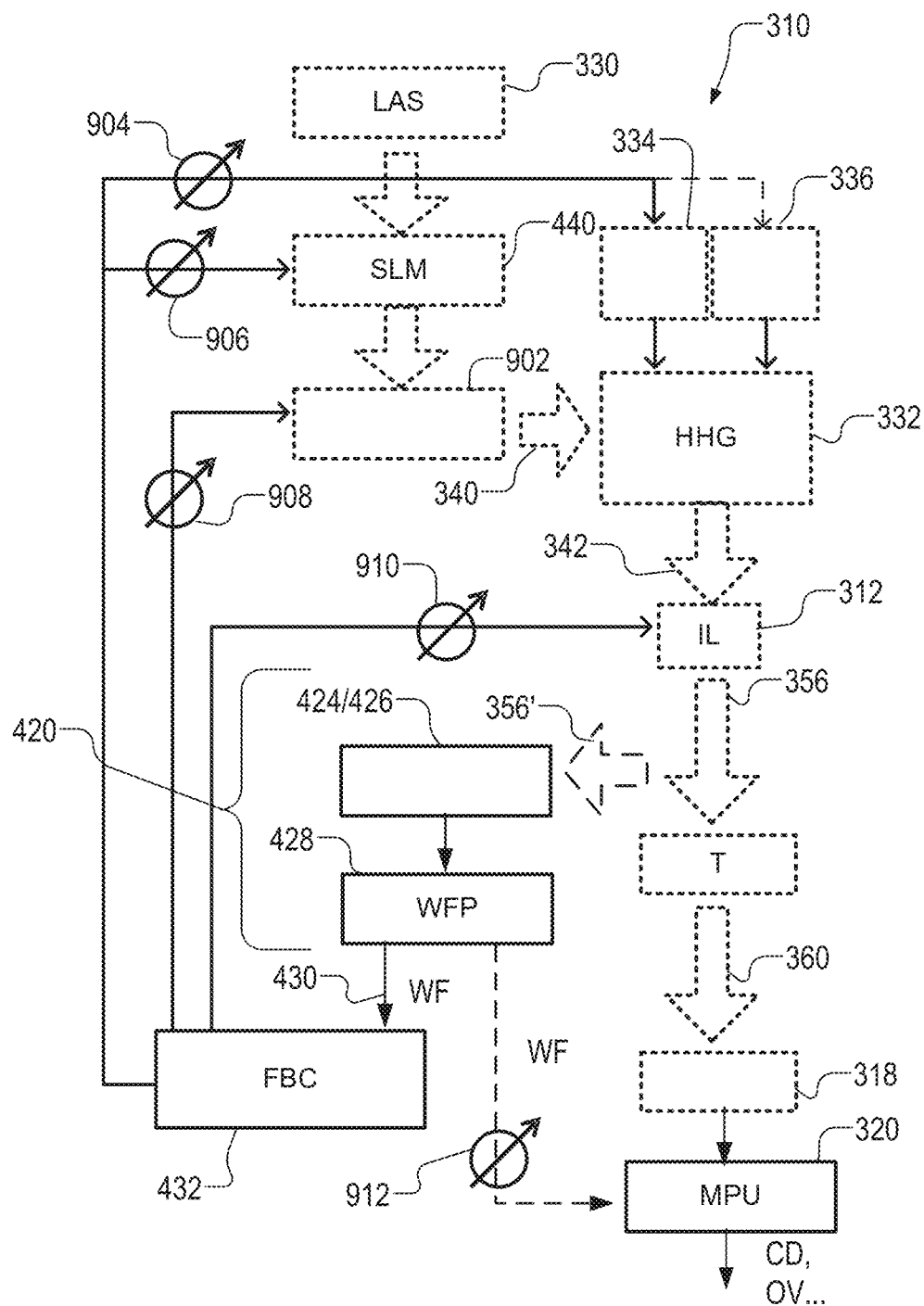
FIG. 17 illustrates schematically the flow of sensor signals and feedback control signals in the inspection apparatus of FIG. 2 according to example embodiments of the present disclosure.

FIG. 17 is an example block diagram of a control system of the radiation source arrangement and the inspection apparatus of FIG. 2. Components identifiable in the hardware drawings of FIG. 2 are shown in dashed lines and labeled with the same reference signs. For example, the drive laser 330 the wavefront compensating device (SLM) 440 and the gas 406 are represented, and the pump radiation (first radiation) 430 and the output EUV radiation (second radiation) 432. A laser beam delivery system 902 is illustrated. Wavefront sensor 420 receives at least a portion 356' of the EUV radiation 356 which is simultaneously or intermittently being directed at target T. Wavefront information 430 from wavefront sensor 420 is processed by feedback controller 432. As schematically represented at 904, 906, 908 and 910, operating parameters of the hardware elements are adjusted by feedback processor 432 (or separate feedback processors) to implement feedback control and stabilize operation of the radiation source arrangement and/or the illumination system over a prolonged period.

A wide range of mechanisms can be implemented in the feedback controller, based on analysis and/or empirical observation of the behavior and observation. Examples of feedback actions can include:

Movement of drive laser focusing lens and/or gas jet position along the drive laser axis can be controlled in response to changes in divergence, spatial coherence properties and/or spectral width of harmonics.

Transverse movement of the drive laser focusing lens or angle of incident drive laser beam direction can be controlled in response to changes in the direction of HHG beam, indicated by wavefront tilts.

The gas pressure in the HHG interaction zone can be controlled in response to changes in phase matching properties, derived from observed intensity and spectral content of the HHG beam.

The drive laser intensity, for example the peak intensity, can be controlled in response to changes in HHG radiation intensity and, optionally, spectral content.

The Spatial shape of the drive laser beam can be varied (either through an adjustable aperture or a spatial light modulator 440) in response to changes in divergence and spatial properties of HHG radiation beam and, optionally, intensity).

Laser pulse shape and duration can be changed by changing the pulse compressor in a laser amplifier system, by adding dispersion into the beam, or by pulse shaping devices such as spatial light modulator 440, all in response to changes in HHG radiation intensity and spectral content.

The functions of hardware control can be implemented in the same processing hardware as the deriving of operating conditions from the wavefront sensor signals. This may also be combined with the wavefront processor itself and/or the metrology processor 320. In other implementations, processing of monitoring signals and control functions may be implemented in separate processing hardware. Once the captured diffraction images signals are digitized, the analysis of them to derive operating conditions and/or to determine appropriate feedback control actions can be implemented by suitable programming, with fixed responses and/or adaptive and machine learning responses.

As also mentioned, alternatively or in addition to controlling the radiation source arrangement 310 and/or illumination system 312, the spectrally resolved and spatially resolved wavefront information can be supplied at 912 to the metrology processor 320. Here it can be used to modify calculations of properties of the target T and/or performance parameters of the lithographic process. For example, the processing of signals from detector 318 can be based on particular assumptions about the spectral properties and/or wavefront shape of the radiation beam 356. It may be assumed for example that the beam comprises a particular mix of spectral components with respective wavefront shapes and intensities. When the wavefront information is obtained showing the actual wavefront shape and intensity for different spectral components at different locations across the beam, the calculations of the properties of interest can be adjusted and made more accurate. Therefore, the wavefront sensor can be used to improve stability of the radiation source arrangement or to improve robustness of the measurements made by the metrology apparatus, or both.

In association with the hardware components of the inspection apparatus, an embodiment may therefore include a computer program containing one or more sequences of machine-readable instructions and/or functional data describing the method of determining an operating condition of a radiation source arrangement, and/or for controlling the radiation source arrangement in response to the determined condition. This computer program may be executed for example within metrology processing unit MPU in the apparatus of FIGS. 2 to 16 and/or the supervisory control system SCS of FIG. 1. There may also be provided a non-transient data storage medium (e.g., semiconductor memory, magnetic or optical disk) having such a computer program stored therein. Where an existing radiation source arrangement is already in production and/or in use, a modified embodiment can be implemented by the provision of an updated computer program product for causing a processor to perform one or more of the methods described herein.

Further modifications of the laser radiation delivery system and other components of the HHG radiation source can be included, which are not detailed herein. Some of these modifications are disclosed for example in US2017184511A1, mentioned above (not published at the priority date of the present application). Other modifications are disclosed in U.S. patent application Ser. No. 15/388,463 and international patent application PCT/EP2016/080103, both claiming priority from European patent application no. 15202301.6 dated Dec. 23, 2015 also not yet been published at the priority date of the present application. European patent application no. 16188816.9 has already been mentioned. The contents of all these applications are incorporated herein by reference, and the techniques described therein can be used in combination with the techniques of the present disclosure.

While the present disclosure presents EUV and SXR radiation between 1-100 nm as an example of particular interest for current technological development, shorter wavelengths in the "harder" x-ray range may be used, having wavelengths for example less than 1 nm and potentially less than 0.1 nm. While inspection by reflection of radiation is described by way of example, the principles of the present disclosure may also be applied in transmissive arrangements, particularly where shorter x-ray radiation can penetrate through the whole substrate.

Figure 18:
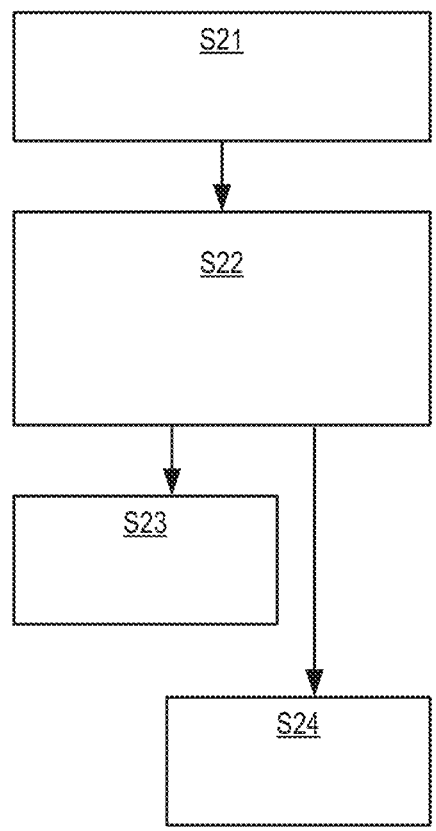
FIG. 18 is a flow chart illustrating a method of controlling performance of a metrology method and/or of a lithographic manufacturing process using measurements made by the inspection apparatus of FIG. 1.

FIG. 18 illustrates the application of an inspection apparatus such as inspection apparatus 302, in the control of a lithographic manufacturing system of the type illustrated in FIG. 1. The steps will be listed here, and then explained in more detail:

S21: Process wafer to produce structures on substrate
S22: Measure CD and/or other parameter across substrate
S23: Update metrology recipe
S24: Update lithography and/or process recipe At step S21, structures are produced across a substrate using the lithographic manufacturing system. At S22, the metrology apparatus 140 and optionally other metrology apparatus and information sources are used to measure a property of the structures across the substrate. In accordance with the principles of the present disclosure, set forth above, properties of one or more targets are measured using EUV or SXR radiation generated by a radiation source arrangement monitored and controlled as described above. The wavefront sensor with spatial and spectral resolution may be used to improve control of the radiation source. Information on the wavefront tilts and/or spectral composition present during measurement may be used to refine the processing of metrology results.

At step S23, optionally, metrology recipes and calibrations of the metrology apparatus are updated in light of the measurement results obtained. A metrology recipe might specify which portions of the diffraction spectra to compare for the most reliable asymmetry measurement. The recipe may specify settings of the laser radiation delivery system also, for example to control spectrum and/or polarization of the SXR radiation. The recipe may also indicate how spectrally resolved wavefront information is to be used to improve accuracy of the metrology apparatus.

At step S24, measurements of overlay or other performance parameters are compared with desired values, and used to update settings of the lithographic apparatus and/or other apparatus within the lithographic manufacturing system.

Concluding Remarks

In the above there is disclosed a modified form of wavefront sensor which provide both spatial resolution in two dimensions and spectral resolution at each location across a radiation beam, in a single captured image.

The wavefront sensor can support improved monitoring and control of a radiation source arrangement. The wavefront sensor can support more accurate calculation of measurements, when a metrology apparatus is dependent on the qualities of a radiation beam produced by an arrangement. Sufficiently fast measurement to provide complete EUV beam information on timescale of an overlay measurement, for example, in high volume manufacturing.

No additional EUV spectrometer is needed to obtain spectral selectivity, because the gratings are integrated in the Hartmann mask. Polarization-sensitive wavefront measurements in the EUV become possible.

The principles of the present disclosure may be applied in any wavelength range, although it is particularly applicable in the EUV/soft-X-ray region where source stability is a needed development, and where optical wavefront sensing methods such as interferometry are problematic.

The aperture array and dispersive elements can be made transmissive or reflective, without deviating from the principles. A variant that works in reflection may comprise for example a grazing incidence conical diffraction configuration. This has advantages in terms of manufacturability and robustness, and gives a completely different parameter space for diffraction geometry and contrast. An analysis of conical diffraction of EUV radiation in grazing incidence is provided in the paper C. Braig, L. Fritzsch, T. Käsebier, E.-B. Kley, C. Laubis, Y. Liu, F. Scholze, and A. Tünnermann, "An EUV beamsplitter based on conical grazing incidence diffraction," Opt. Express 20, 1825-1838 (2012).

Implementation of the wavefront processing can be straightforward. Diffraction spots corresponding to a single wavelength are localized by a chosen numerical method, after which the wavefront reconstruction for each spectral component can proceed through established conventional reconstruction routines for Hartmann/Shack-Hartmann wavefront sensors.

The wavelength range, spectral resolution and wavefront curvatures that can be characterized with a given mask (aperture array) depend on the geometric parameters (hole sizes and positions, grating pitch, distance to camera, sensor pixel size, etc. Focusing elements can be substituted for an array of apertures, or added to an array of aperture. Such focusing elements can be made the focus elements, either in reflective or transmissive form (wavelength permitting), and the same applies to the dispersive elements. Spectral resolution can be obtained by dividing the wavelength spectrum into as few as two spectral components, or many hundreds. Each spectral component could be defined by a very broad band of wavelengths, or by a very narrow band, according to what is practical, and what is required for a given purpose.

Optionally, the sensor can be scanned relative to the beam to increase the spatial resolution of the wavefront, e.g. if the desired spectral range and spectral resolution demand a large spacing between the individual holes/gratings. Compared to other scanning configurations, the inherent spatial resolution of the wavefront sensor means that the required scanning range is small (about the distance between the apertures).

Modeling of the expected diffraction by the aperture array would extend the ability to characterize complex wavefronts and complex spectra. For example, understanding the shape of every spot (which relates to the shape of the apertures), allowing a more precise determination of the center positions.

The principles of the present disclosure can be applied with EUV sources such as high-harmonic generation sources, but also with less coherent sources such as (spatially filtered) plasma discharges.

Polarization sensitivity can also be included in the approach. If the grating diffraction efficiency is polarization-dependent, orienting a subset of the gratings in the orthogonal direction can sample the local polarization state of the wavefront. Alternatively, the mask or other component defining the aperture array can be rotated by 90 degrees for a second measurement. Gratings with a more complex shape and orientation could be considered, to achieve a similar effect. In other words, measuring the relative intensities of the spots that are associated with these different subsets/orientations will give some information about the polarization state of the radiation beam, with some spatial resolution across the beam. Polarization sensitivity of the gratings can also be introduced by tuning the grating pitch, mask thickness and choice of materials for the mask.

By using blazed gratings, one diffraction order can be suppressed, and this allows for a more dense packing (and hence, increased resolution) of the holes/gratings in the sensor.

In the application to metrology, the target structures described above may be metrology targets specifically designed and formed for the purposes of measurement, in other embodiments, properties may be measured on targets which are functional parts of devices formed on the substrate. Many devices have regular, periodic structures akin to a grating. The term "target", "grating" or "periodic structure" of a target as used herein does not require that the applicable structure has been provided specifically for the measurement being performed. Further, pitch P of the metrology target is close to the resolution limit of the optical system of the measurement tool, but may be much larger than the dimension of typical product features made by a patterning process in the target portions C. In practice, the features and/or spaces of the gratings may be made to include smaller structures similar in dimension to the product features.

Further embodiments are disclosed in the subsequent numbered clauses:

1. A radiation source arrangement operable to generate a beam of radiation, the radiation source arrangement further comprising:
   a wavefront sensor for at least intermittently measuring a tilt of a wavefront at an array of locations across the generated beam of radiation; and
   a processor for determining an operating condition of the radiation source arrangement based at least partly on the measured wavefront tilt,
   wherein said wavefront sensor is provided with a dispersive element at each location in said array, and is arranged to measure wavefront tilts with spectral resolution at each location in said array.

2. A radiation source arrangement according to clause 1 wherein the array of locations is defined by one or more spacing vectors, and wherein a direction of dispersion of each dispersive element is not parallel with any of said spacing vectors.

3. A radiation source arrangement according to clause 2 wherein the array of locations is divided into two or more subsets, the dispersive elements of each subset having a different direction of dispersion.

4. A radiation source arrangement according to any preceding clause wherein said dispersive elements comprise diffraction gratings, the radiation at each location in the array being spread into a spectrum including positive and negative diffraction orders for a plurality of spectral components.

5. A radiation source arrangement according to clause 4 wherein said wavefront sensor is operable to compute a wavefront tilt for each spectral component at each location in the array based on detection of the positive and negative diffraction orders of that spectral component.

6. A radiation source arrangement according to clause 5 wherein said wavefront sensor comprises an image detector for capturing positions and intensities of said positive and negative diffraction orders for different spectral components and different locations within a single image, the different spectral components and different locations being identified by their positions within the captured image, based on knowledge of a harmonic structure of the generated radiation and knowledge of the dispersive properties of each dispersive element.

7. A radiation source arrangement according to clause 6 wherein said wavefront tilt is computed based on detected positions of said positive and negative diffraction orders, relative to reference positions determined by calculation and/or calibration.

8. A radiation source arrangement according to clause 4 wherein said dispersive elements provide a plurality of different directions of dispersion, and wherein wavefront tilts for a plurality of spectral components at a location in the array are determined by combining of positive and negative orders from diffraction spectra having at least two directions of dispersion.

9. A radiation source arrangement according to clause 8 wherein a wavefront tilt is determined at least partly from a deviation of a captured diffraction spectrum in a direction transverse to the direction of dispersion.

10. A radiation source arrangement according to clause 8 or 9 wherein a wavefront tilt is determined at least partly from a distortion of a captured diffraction spectrum in a direction parallel to the direction of dispersion.

11. A radiation source arrangement according to clause 8 or 9 or 10 wherein said wavefront tilts are determined by an iterative process, comparing expected diffraction patterns with a captured diffraction pattern.

12. A radiation source arrangement according to any preceding clause wherein the processor is arranged to use the measured wavefront tilts for different spectral components to determine an operating condition of the radiation source arrangement.

13. A radiation source arrangement according to any preceding clause wherein said wavefront sensor is further operable to measure relative intensities of said spectral components at each location in the array, information of the relative intensities being used in said processor to determine an operating condition of the radiation source arrangement.

14. A radiation source arrangement according to any preceding clause wherein said wavefront sensor is further operable to measure a spectral width of one or more of said spectral components at each location in the array, information of the spectral width being used in said processor to determine an operating condition of the radiation source arrangement.

15. A radiation source arrangement according to any preceding clause wherein said wavefront sensor is further operable to measure a polarization property of one or more of said spectral components at each location in the array, the measured polarization property being used in said processor to determine an operating condition of the radiation source arrangement.

16. A radiation source arrangement according to any preceding clause wherein said wavefront sensor is further operable to measure a spatial coherence property of one or more of said spectral components at each location in the array, the measured spatial coherence property being used in said processor to determine an operating condition of the radiation source arrangement.

17. A radiation source arrangement according to any preceding clause wherein said array of locations is defined by an array of apertures, each aperture in the array being provided with a dispersive element for directing said spectral components in different directions.

18. A radiation source arrangement according to any of clauses 1 to 17 wherein said array of locations is defined by an array of focusing elements, each focusing element in the array being provided with a dispersive element for directing said spectral components in different directions.

19. A radiation source arrangement according to clause 17 or 18 wherein said dispersive elements are diffraction gratings.

20. A radiation source arrangement according to any preceding clause wherein the generated beam of radiation includes wavelengths shorter than 100 nm.

21. A radiation source arrangement according to any preceding clause further comprising a controller for adjusting at least one operating parameter of the radiation source arrangement automatically in response at least partly to the operating condition determined by the processor.

22. A radiation source arrangement according to clause 21 arranged to cause an interaction between first radiation and a medium and thereby to generate said beam of radiation by higher harmonic generation.

23. A radiation source arrangement according to clause 22 wherein the medium is a gaseous medium.

24. A radiation source arrangement according to clause 22 or 23 wherein the adjusted operating parameter is an operating parameter of a source and/or beam delivery system of the first radiation, such as a pulse intensity or duration beam width, an axial focus position, a transverse focus position or a wavefront.

25. A radiation source arrangement according to clause 23 or 24 wherein the adjusted operating parameter is a parameter of the medium.

26. A radiation source arrangement according to clause 25 wherein the medium is a gas jet and the adjusted operating parameter is an operating parameter of a gas delivery system.

27. A radiation source arrangement according to any preceding clause wherein said processor is operable to output diagnostic information based at least partly on the determined operating condition.

28. A radiation source arrangement according to clause 27 wherein the medium is a gas jet and the diagnostic information relates to a wear condition of a part of the radiation source arrangement.

29. An inspection apparatus comprising an illumination system for delivering inspection radiation to a target structure and a detection system for detecting said inspection radiation after interaction with the target structure, and wherein the illumination system includes a radiation source arrangement according to any preceding clause, the generated beam of radiation being used as said inspection radiation.

30. An inspection apparatus according to clause 29 wherein the inspection radiation includes wavelengths shorter than 100 nm.

31. An inspection apparatus according to clause 30 further comprising a processing arrangement for determining a property of the target structure based on detected inspection radiation.

32. An inspection apparatus according to clause 31 wherein said processing arrangement is further arranged to calculate a first performance parameter of a lithographic process based at least partly on the determined property of the target structure.

33. An inspection apparatus according to clause 31 or 32 wherein said processing arrangement is arranged to determine said property of the target structure and/or said first performance parameter based further on an output of the wavefront sensor.

34. An inspection apparatus according to any of clauses 29 to 33 wherein said wavefront sensor is arranged to receive a portion of the inspection radiation continuously while another portion of the inspection radiation interacts with the target structure.

35. An inspection apparatus according to any of clauses 29 to 33 wherein said wavefront sensor is arranged to receive at least a portion of the inspection radiation intermittently at times other than while the inspection radiation interacts with the target structure.

36. An inspection apparatus according to any of clauses 29 to 35 wherein said wavefront sensor is arranged to receive at least a portion of said inspection radiation downstream of a focusing element of said illumination system.

37. A wavefront sensor for measuring a tilt of a wavefront at an array of locations across a beam of radiation, wherein said wavefront sensor is provided with a dispersive element at each location in said array and is arranged to measure wavefront tilts with spectral resolution at each location in said array.

38. A wavefront sensor according to clause 37 wherein the array of locations is defined by one or more spacing vectors, and wherein a direction of dispersion of each dispersive element is not parallel with any of said spacing vectors.

39. A wavefront sensor according to clause 38 wherein the array of locations is divided into two or more subsets, the dispersive elements of each subset having a different direction of dispersion.

40. A wavefront sensor according to any of clauses 37 to 39 wherein said dispersive elements comprise diffraction gratings, the radiation at each location in the array being spread into a spectrum including positive and negative diffraction orders for a plurality of spectral components.

41. A wavefront sensor according to clause 40 wherein said wavefront sensor is operable to compute a wavefront tilt for each spectral component at each location in the array based on detection of the positive and negative diffraction orders of that spectral component.

42. A wavefront sensor according to clause 41 wherein said wavefront sensor comprises an image detector for capturing positions and intensities of said positive and negative diffraction orders for different spectral components and different locations within a single image, the different spectral components and different locations being identified by their positions within the captured image, based on knowledge of a harmonic structure of the beam of radiation and knowledge of the dispersive properties of each dispersive element.

43. A wavefront sensor according to clause 42 wherein said wavefront tilt is computed based on detected positions of said positive and negative diffraction orders, relative to reference positions determined by calculation and/or calibration.

44. A wavefront sensor according to clause 40 wherein said dispersive elements provide a plurality of different directions of dispersion, and wherein wavefront tilts for a plurality of spectral components at a location in the array are determined by combining of positive and negative orders from diffraction spectra having at least two directions of dispersion.

45. A wavefront sensor according to clause 44 wherein a wavefront tilt is determined at least partly from a deviation of a captured diffraction spectrum in a direction transverse to the direction of dispersion.

46. A wavefront sensor according to clause 44 or 45 wherein a wavefront tilt is determined at least partly from a distortion of a captured diffraction spectrum in a direction parallel to the direction of dispersion.

47. A wavefront sensor according to clause 44 or 45 or 46 wherein said wavefront tilts are determined by an iterative process, comparing expected diffraction patterns with a captured diffraction pattern.

48. A wavefront sensor according to any of clauses 37 to 47 wherein said wavefront sensor is further operable to measure relative intensities of said spectral components at each location in the array.

49. A wavefront sensor according to any of clauses 37 to 48 wherein said wavefront sensor is further operable to measure a spectral width of one or more of said spectral components at each location in the array.

50. A wavefront sensor according to any of clauses 37 to 49 wherein said wavefront sensor is further operable to measure a polarization property of one or more of said spectral components at each location in the array.

51. A wavefront sensor according to any of clauses 37 to 50 wherein said wavefront sensor is further operable to measure a spatial coherence property of one or more of said spectral components at each location in the array.

52. A wavefront sensor according to any of clauses 37 to 51 wherein said array of locations is defined by an array of apertures, each aperture in the array being provided with a dispersive element for directing said spectral components in different directions.

53. A wavefront sensor according to any of clauses 37 to 51 wherein said array of locations is defined by an array of focusing elements, each focusing element in the array being provided with a dispersive element for directing said spectral components in different directions.

54. A wavefront sensor according to clause 52 or 53 wherein said dispersive elements are diffraction gratings.

55. A method of monitoring an operating condition of a radiation source arrangement, the method comprising at least intermittently measuring a tilt of a wavefront at an array of locations across a beam of radiation generated by said radiation source arrangement and determining an operating condition of the radiation source arrangement based at least partly on the measured wavefront tilt, wherein wavefront tilts are measured with spectral resolution at each location in said array.

56. A method according to clause 55 wherein the wavefront tilts for the plurality of spectral components are measured by providing a dispersive element at each location in said array.

57. A method according to clause 56 wherein a wavefront tilt for each spectral component is computed based on detected positions of positive and negative diffraction orders, relative to reference positions determined by calculation and/or calibration.

58. A method according to any of clauses 55 to 57 further comprising adjusting at least one operating parameter of the method automatically in response at least partly to the operating condition determined by the processor.

59. A method according to clause 58 wherein arranged to cause an interaction between first radiation and a medium and thereby to generate said beam of radiation by higher harmonic generation, and wherein the adjusted operating parameter is an operating parameter of a beam delivery system of the first radiation.

60. A method according to any of clauses 55 to 59 wherein the adjusted operating parameter is a parameter of the medium.

61. A method according to clause 60 wherein the medium is a gas jet and the adjusted operating parameter is an operating parameter of a gas delivery system.

62. A method according to any of clauses 55 to 61 further comprising outputting diagnostic information based at least partly on the determined operating condition.

63. A method of inspecting structures that have been formed on a substrate by a lithographic process, the method comprising:
illuminating a target structure with inspection radiation generated by a radiation source arrangement controlled by the method of any of clauses 58 to 62; and
detecting a portion of said inspection radiation after interaction with the target structure.

64. A method according to clause 63 further comprising determining a property of target structure based at least partly on the detected portion of said inspection radiation.

65. A method according to clause 63 or 64 further comprising determining at least one performance parameter of the lithographic process based at least partly on determined property of the target structure.

66. A method of manufacturing devices, the method including a lithographic process step, wherein, before or after performing said lithographic process step, properties of one or more target structures on a substrate are determined by a method according to any of clauses 63 to 65 and wherein the determined properties are used to adjust parameters of the lithographic process step for the processing of the substrate and/or further substrates.

67. A computer program product comprising machine-readable instructions for causing a processor to implement the processor of a radiation source arrangement according to any of clauses 1 to 28.

68. A computer program product comprising machine-readable instructions for causing a processor to compute wavefront tilts for a plurality of spectral components in the wavefront sensor of a radiation source arrangement according to any of clauses 1 to 28 or the wavefront sensor of any of clauses 37 to 54.

69. A computer program product comprising machine-readable instructions for causing a processor to implement the controller of a radiation source arrangement according to any of clauses 21 to 26.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A wavefront sensor, comprising:
an aperture array having a plurality of locations, the aperture array comprising a membrane having an aperture formed therein at each of the plurality of locations, wherein the apertures are configured to pass radiation; and a dispersive element at each location in the aperture array, wherein the wavefront sensor is configured to be positioned in a beam of radiation and to measure wavefront tilts with spectral resolution across the beam of radiation at each location in the aperture array.

2. The wavefront sensor of claim 1, wherein:

the array of locations is defined by one or more spacing vectors, and a direction of dispersion of each dispersive element is not parallel with any of the spacing vectors.

3. The wavefront sensor of claim 2, wherein the array of locations is divided into two or more subsets, the dispersive elements of each subset having a different direction of dispersion.

4. The wavefront sensor of claim 1, wherein the dispersive elements comprise diffraction gratings, the radiation at each location in the aperture array being spread into a spectrum including positive and negative diffraction orders for a plurality of spectral components.

5. The wavefront sensor of claim 4, wherein the wavefront sensor is operable to compute wavefront tilt for each spectral component at each location in the aperture array based on detection of the positive and negative diffraction orders of that spectral component.

6. The wavefront sensor of claim 5, wherein the wavefront sensor comprises an image detector configured to capture positions and intensities of the positive and negative diffraction orders for different spectral components and different locations within a single image, the different spectral components and different locations being identified by their positions within the captured image, based on knowledge of a harmonic structure of the beam of radiation and knowledge of the dispersive properties of each dispersive element.

7. The wavefront sensor of claim 6, wherein the wavefront tilt is computed based on detected positions of the positive and negative diffraction orders, relative to reference positions determined by calculation and/or calibration.

8. The wavefront sensor of claim 4, wherein:

the dispersive elements provide a plurality of different directions of dispersion, and wavefront tilts for a plurality of spectral components at a location in the aperture array are determined by combining of positive and negative orders from diffraction spectra having at least two directions of dispersion.

9. The wavefront sensor of claim 8, wherein wavefront tilt is determined at least partly from:

a deviation of a captured diffraction spectrum in a direction transverse to the direction of dispersion, or a distortion of a captured diffraction spectrum in a direction parallel to the direction of dispersion.

10. The wavefront sensor of claim 8, wherein the wavefront tilts are determined by an iterative process, comparing expected diffraction patterns with a captured diffraction pattern.

11. The wavefront sensor of claim 1, the wherein wavefront sensor is further operable to measure:

relative intensities of the spectral components at each location in the array, a spectral width of one or more of the spectral components at each location in the array, a polarization property of one or more of the spectral components at each location in the array, or a spatial coherence property of one or more of the spectral components at each location in the array.

12. The wavefront sensor of claim 1, wherein the array of locations is defined by an array of:

apertures, each aperture in the array being provided with a dispersive element for directing said spectral components in different directions, or focusing elements, each focusing element in the array being provided with a dispersive element for directing said spectral components in different directions.

13. A method of monitoring an operating condition of a radiation source arrangement, the method comprising:

intermittently measuring, using the wavefront sensor of claim 1, a tilt of a wavefront at an array of locations across a beam of radiation generated by the radiation source arrangement;

determining, using a processor, an operating condition of the radiation source arrangement based at least partly on the wavefront tilt, wherein the wavefront tilts are measured with spectral resolution at each location in the array of locations; and adjusting an operating parameter of the method automatically in response to the operating condition determined by the processor.

14. A method of monitoring an operating condition of a radiation source arrangement, the method comprising:

intermittently measuring a tilt of a wavefront at an array of locations across a beam of radiation generated by the radiation source arrangement;

determining, using a processor, an operating condition of the radiation source arrangement based at least partly on the wavefront tilt, wherein the wavefront tilts are measured with spectral resolution at each location in the array of locations; and adjusting an operating parameter of the method automatically in response to the operating condition determined by the processor.

15. The method to claim 14, wherein the wavefront tilts for the plurality of spectral components are measured by providing a dispersive element at each location in the array.

16. The method of claim 15, wherein wavefront tilt for each spectral component is computed based on detected positions of positive and negative diffraction orders, relative to reference positions determined by calculation and/or calibration.

17. The method of claim 14, further comprising:

causing an interaction between radiation and a medium to generate the beam of radiation by higher harmonic generation, wherein the adjusted operating parameter is an operating parameter of a beam delivery system of the radiation.

18. The method of claim 14, wherein the adjusted operating parameter is a parameter of a medium.

19. The method of claim 18, wherein the medium is a gas jet and the adjusted operating parameter is an operating parameter of a gas delivery system.

20. The method of claim 14, further comprising outputting diagnostic information based at least partly on the determined operating condition.

* * * * *

UNITED STATES PATENT AND TRADEMARK OFFICE
CERTIFICATE OF CORRECTION

| | |
|---|---|
| PATENT NO. | : 11,391,677 B2 |
| APPLICATION NO. | : 16/751104 |
| DATED | : July 19, 2022 |
| INVENTOR(S) | : Witte et al. |

It is certified that error appears in the above-identified patent and that said Letters Patent is hereby corrected as shown below:

In the Specification

In Column 6, Line 38, after "of", delete "for".

In Column 15, Line 44, delete "that that," and insert -- that, --, therefor.

In the Claims

In Column 37, Claim 9, Line 48, after "wherein", insert -- the --.

In Column 37, Claim 11, Line 58, delete "the wherein" and insert -- wherein the --, therefor.

In Column 38, Claim 15, Line 41, delete "to" and insert -- of --, therefor.

Signed and Sealed this
Eighteenth Day of June, 2024

Katherine Kelly Vidal
*Director of the United States Patent and Trademark Office*